(12) United States Patent
Own et al.

(10) Patent No.: US 8,324,574 B2
(45) Date of Patent: Dec. 4, 2012

(54) ABERRATION-CORRECTING DARK-FIELD ELECTRON MICROSCOPY

(75) Inventors: Christopher Su-Yan Own, Seattle, WA (US); Andrew Bleloch, Chorley (GB); Paul John Dabrowski, Redwood City, CA (US)

(73) Assignee: Mochii, Inc., Seattle, WA (US)

( * ) Notice: Subject to any disclaimer, the term of this patent is extended or adjusted under 35 U.S.C. 154(b) by 0 days.

(21) Appl. No.: 13/024,961

(22) Filed: Feb. 10, 2011

(65) Prior Publication Data

US 2011/0192976 A1    Aug. 11, 2011

Related U.S. Application Data

(60) Provisional application No. 61/303,260, filed on Feb. 10, 2010, provisional application No. 61/352,243, filed on Jun. 7, 2010.

(51) Int. Cl.
*G01N 23/00* (2006.01)
*G01N 13/12* (2006.01)
*H01J 37/26* (2006.01)

(52) U.S. Cl. ..... 250/311; 250/310; 250/306; 250/396 R; 250/397; 250/492.3; 315/111.81

(58) Field of Classification Search ............ 250/311, 250/310, 306, 396 R, 397, 492.3; 315/111.81
See application file for complete search history.

(56) References Cited

U.S. PATENT DOCUMENTS

| | | | |
|---|---|---|---|
| 4,811,218 A | 3/1989 | Hunkapiller et al. | |
| 5,470,707 A | 11/1995 | Sasaki et al. | |
| 5,601,982 A | 2/1997 | Sargent et al. | |
| 7,235,784 B2 | 6/2007 | Taniguchi et al. | |
| 7,288,379 B2 | 10/2007 | Glover | |
| 7,332,284 B2 | 2/2008 | Nagayama | |
| 7,419,833 B2 | 9/2008 | Nagayama | |
| 7,442,931 B2 | 10/2008 | Zewail et al. | |
| 7,521,675 B2 * | 4/2009 | Kawasaki et al. | 250/310 |
| 7,714,286 B2 * | 5/2010 | Nakano et al. | 250/310 |
| 7,777,185 B2 * | 8/2010 | de Jonge | 250/311 |
| 2007/0158567 A1 | 7/2007 | Nakamura et al. | |
| 2007/0158568 A1 | 7/2007 | Nakamura et al. | |

(Continued)

FOREIGN PATENT DOCUMENTS

EP    1793410 A1    6/2007

OTHER PUBLICATIONS

International Search Report and Written Opinion of the International Searching Authority. Jan. 13, 2012. International Application No. PCT/US2011/039515.

(Continued)

*Primary Examiner* — Nikita Wells
(74) *Attorney, Agent, or Firm* — Mei & Mark LLP

(57) ABSTRACT

A transmission electron microscope includes an electron beam source to generate an electron beam. Beam optics are provided to converge the electron beam. An aberration corrector corrects the electron beam for at least a spherical aberration. A specimen holder is provided to hold a specimen in the path of the electron beam. A detector is used to detect the electron beam transmitted through the specimen. The transmission electron microscope operates in a dark-field mode in which a zero beam of the electron beam is not detected. The microscope may also be capable of operating in an incoherent illumination mode.

20 Claims, 21 Drawing Sheets

U.S. PATENT DOCUMENTS

2008/0011949 A1 1/2008 Sannomiya et al.
2011/0233403 A1* 9/2011 Own et al. .................. 250/311

OTHER PUBLICATIONS

Van Aken, R.H., et al. "Low-energy foil aberration corrector." Ultramicroscopy 93 (2002) 321-330.

Bals, S., et al. "Annular dark field imaging in a TEM." Solid State Communications 130 (2004) 675-680.

Bals, S., et al. "Nonlinear imaging using annular dark field TEM." Ultramicroscopy 104 (2005) 281-289.

Dungey, J.W., et al. "Coaxial electron lenses." (1947) Proc. Phys. Soc. 59 828.

Hawkes, P.W. "Aberration correction past and present." Phil. Trans. R. Soc. A (2009) 367, 3637-3664.

Kato, M., et al. "Spherical aberration correction of electrostatic lenses using spherical meshes." J. Vac. Sci. Technol. A 13(4), Jul./Aug. 1995.

Kurihara, Kenji. "Low-Aberration Einzel Lens for a Focused-Ion-Beam System." Japanese Journal of Applied Physics, vol. 24, No. 2, Feb. 1985, pp. 225-230.

Orloff, J., et al. "An asymmetric electrostatic lens for field-emission microprobe applications." J. Appl. Phys. 50(4), Apr. 1979.

Baranova, L.A., et al. "Computational simulation of an electrostatic aberration corrector for a low-voltage scanning electron microscope." Nuclear Instruments and Methods in Physics Research A 519 (2004) 42-48.

Rempfer, Gertrude F. "Unipotential electrostatic lenses: Paraxial properties and aberrations of focal length and focal point." J. Appl. Phys. 57 (7), Apr. 1, 1985.

* cited by examiner

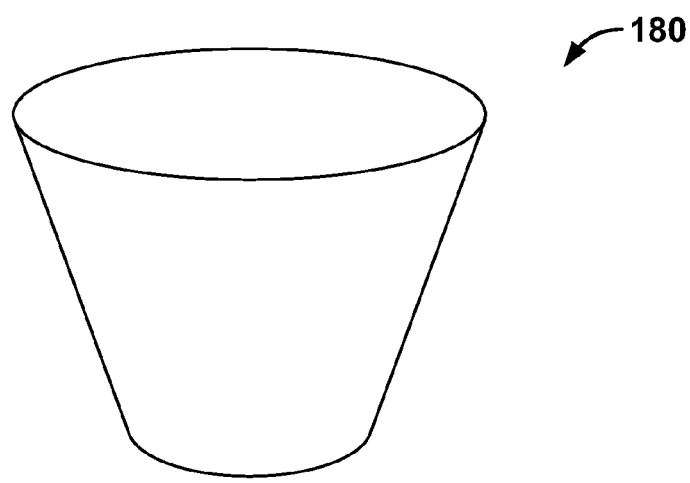
FIG. 3B
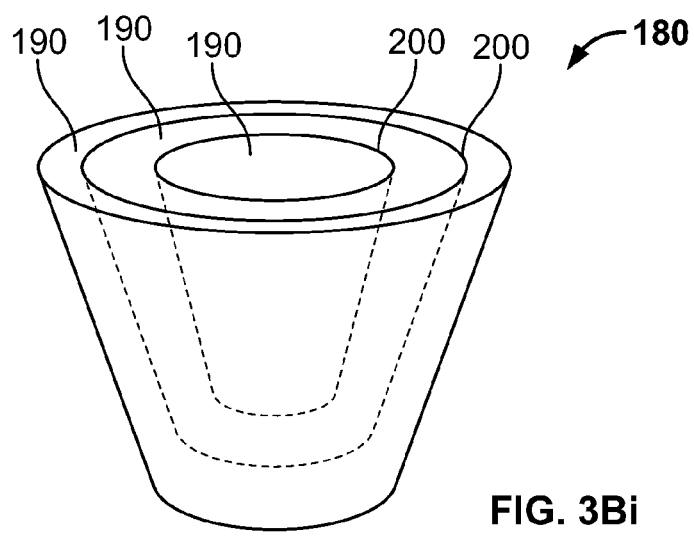
FIG. 3Bi
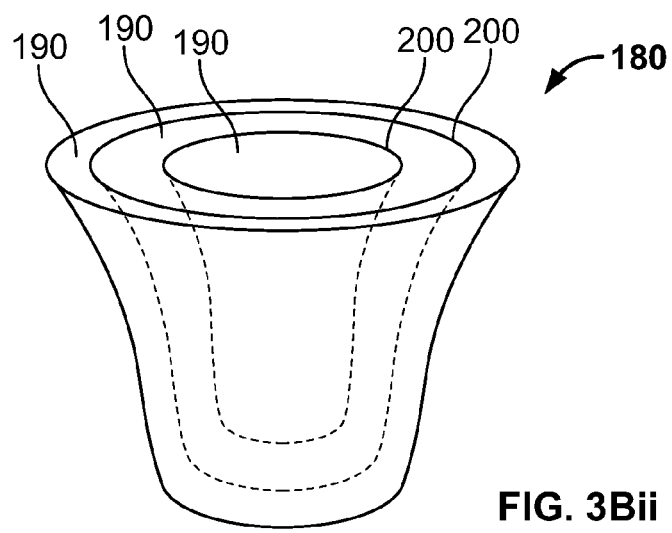
FIG. 3Bii

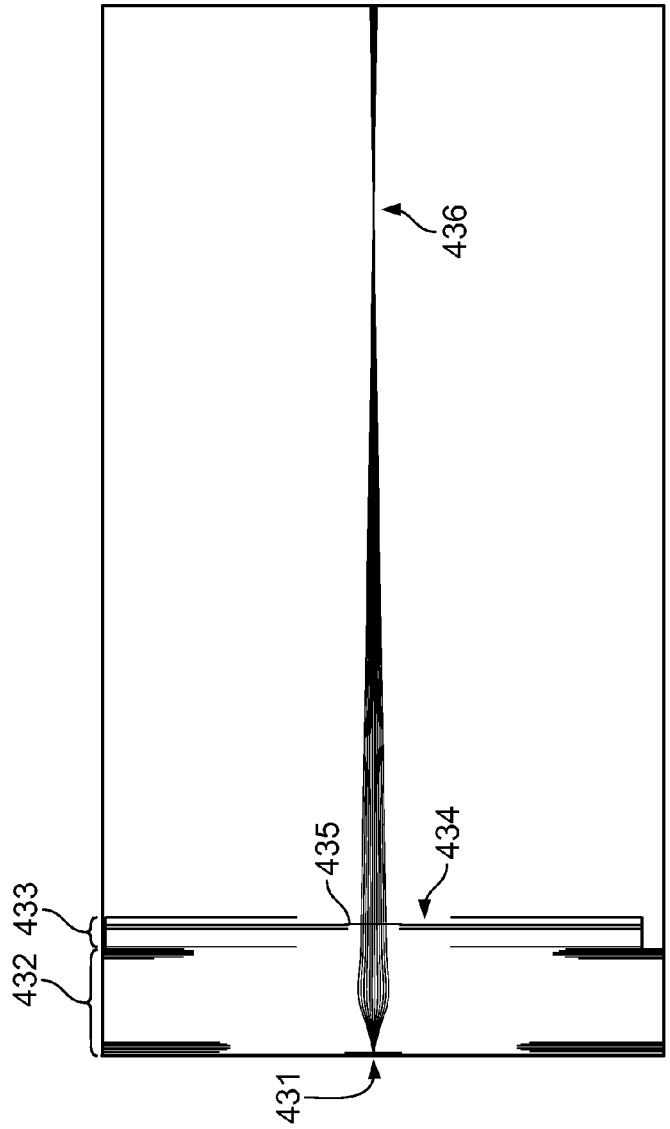
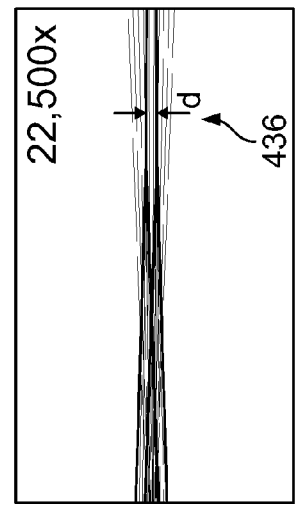
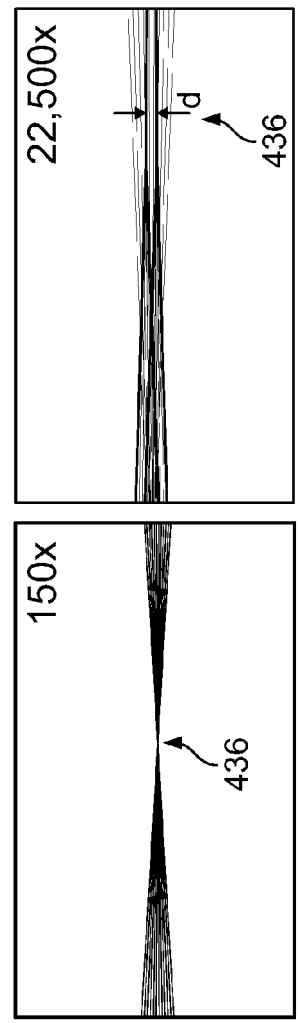

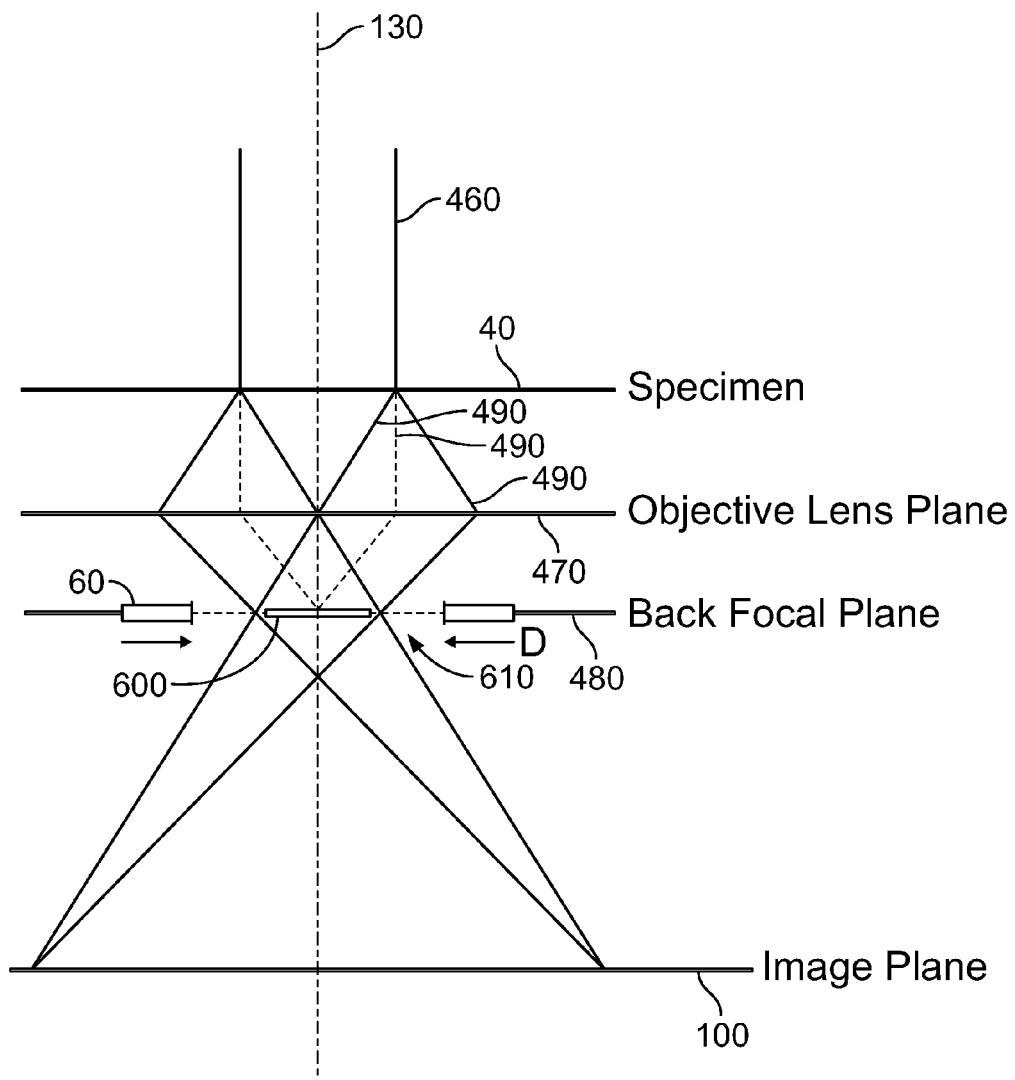
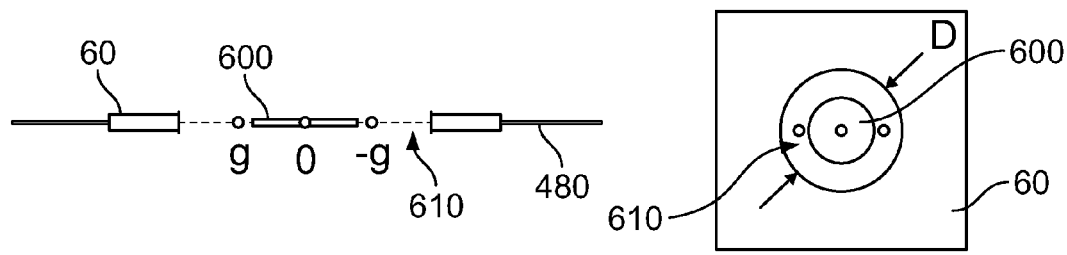
Projection of Back Focal Plane in Two Dimensions
FIG. 10

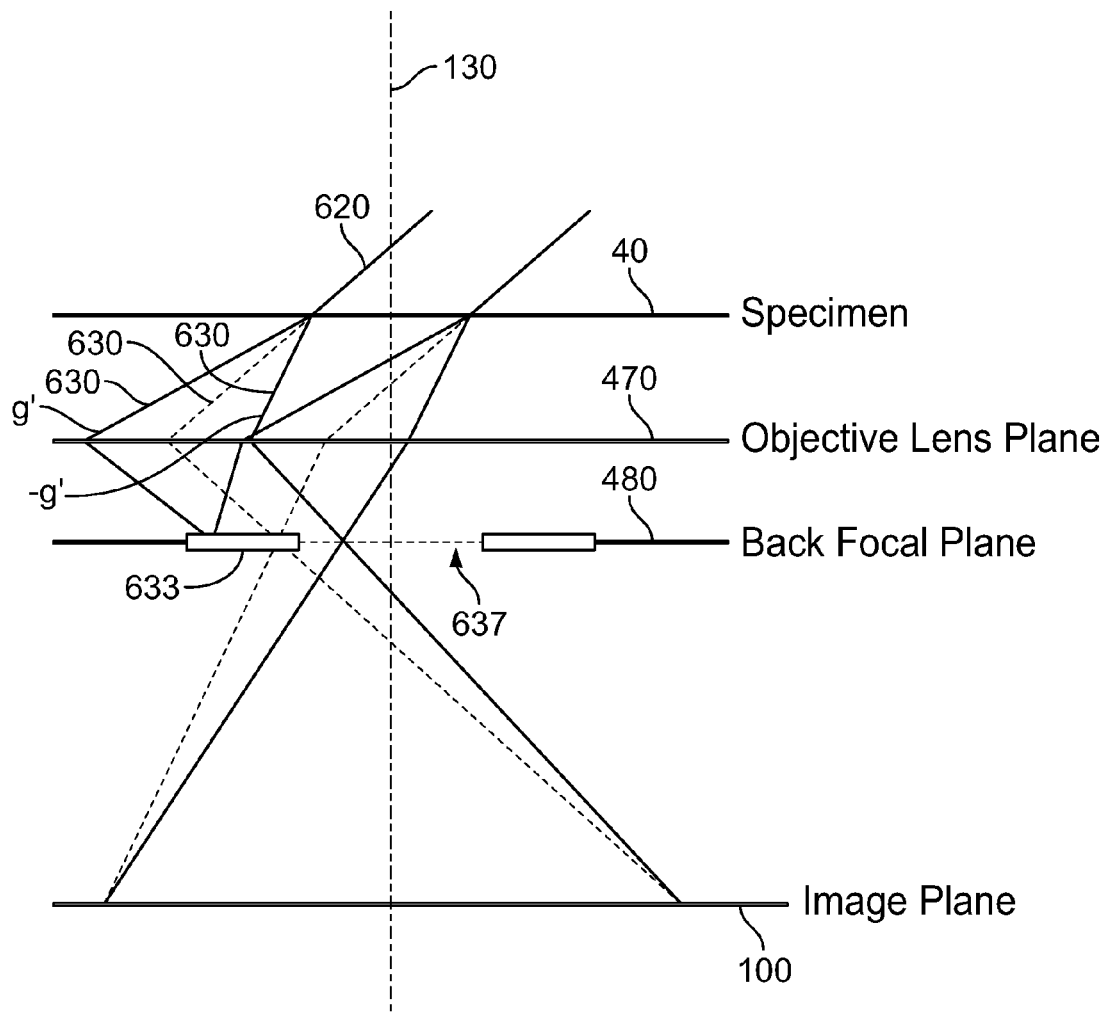
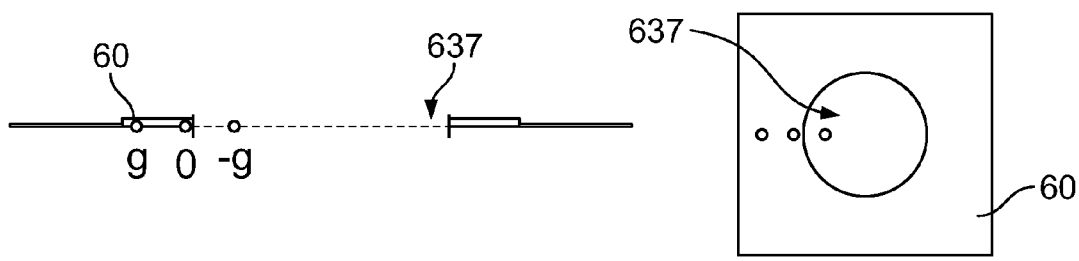
FIG. 11

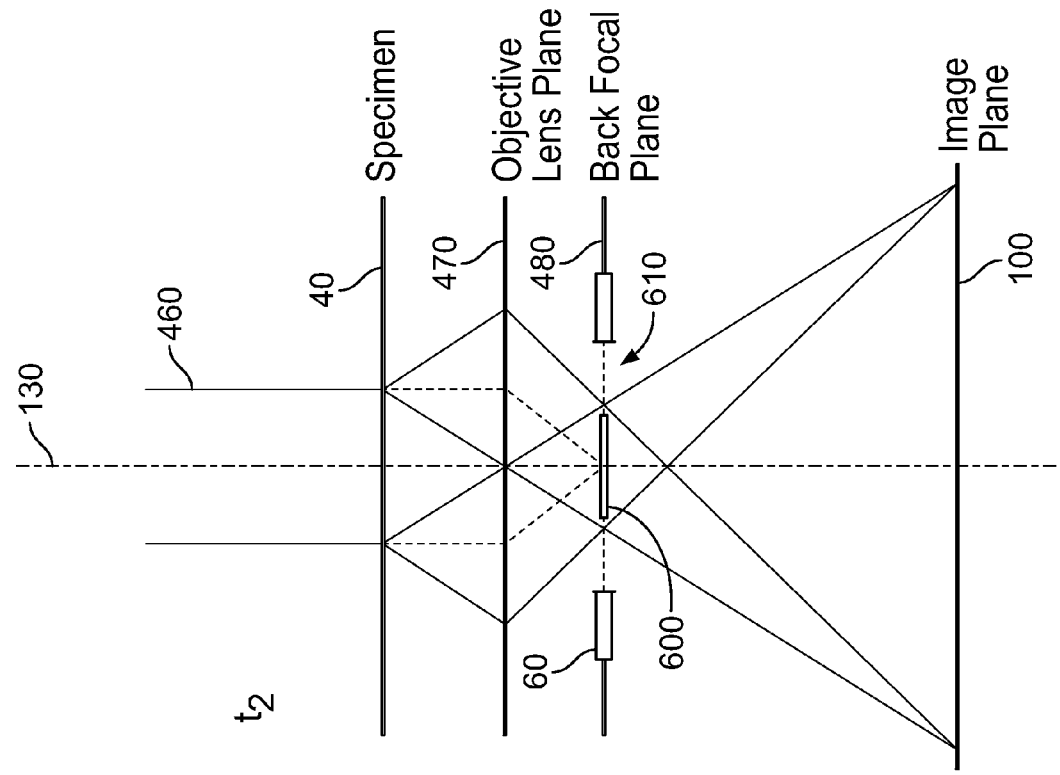
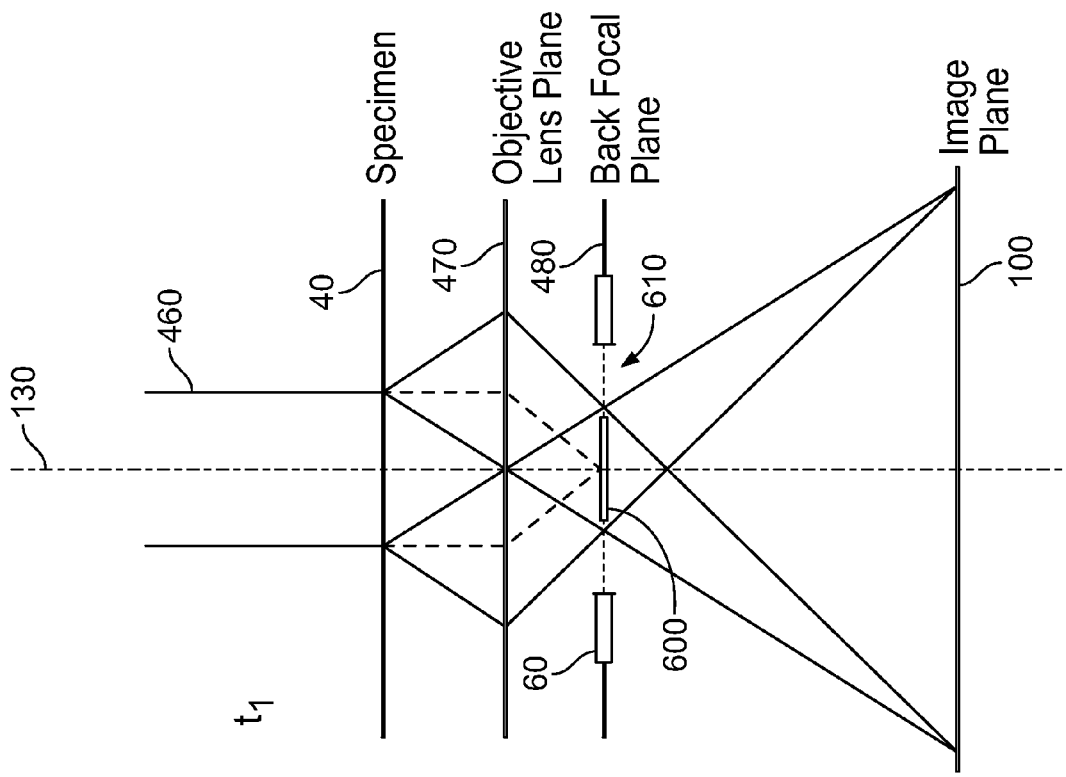
FIG. 14

ABERRATION-CORRECTING DARK-FIELD ELECTRON MICROSCOPY

CLAIM FOR PRIORITY

This application claims priority under 35 U.S.C. §119(e) to Provisional Application No. 61/303,260, filed Feb. 10, 2010, and Provisional Application No. 61/352,243, filed Jun. 7, 2010, which are incorporated herein by reference in their entireties.

TECHNICAL FIELD

This application relates to aberration-correcting, dark-field electron microscopy.

BACKGROUND

There are applications in which it is desirable to use electron microscopy to resolve a single point-like object in a specimen. The single point-like object may be, for example, a single atom or a cluster of atoms on an amorphous substrate. Electron microscopy could theoretically be used to sequence bases of a nucleic acid, for example, such as the bases of a strand of deoxyribonucleic acid (DNA).

Scanning transmission electron microscopy (STEM), which raster scans an electron beam across a specimen, can be used to resolve single point-like objects in an image. However, STEM typically suffers from a slow scanning time, which causes poor throughput. For example, STEM may involve scanning for a time on the order of 1 µs to 10 µs per pixel of the image. This scanning time may be inadequate where sequential resolution of numerous single point-like objects is desired. STEM throughput may be inadequate, for example, for sequencing a full human genome in a practical amount of time.

Transmission electron microscopy (TEM), unlike STEM, images the specimen in parallel. But TEM imaging can be problematic when trying to resolve single point-like objects because the phase-contrast information is typically not directly interpretable for this purpose. For example, a light area in a TEM image could represent either an atom or the absence of an atom. Accordingly, although TEM may have good throughput, it does not typically yield the desired information about the specimen.

Thus, it is desirable to have electron microscopy that can reliably resolve point-like objects. It is further desirable for such electron microscopy to have substantially high throughput. Moreover, it is desirable for such electron microscopy to be provided at an affordable cost.

SUMMARY

In one embodiment, a transmission electron microscope comprises an electron beam source to generate an electron beam. Beam optics are provided to converge the electron beam. The microscope further comprises an aberration corrector to correct the electron beam for at least a spherical aberration. A specimen holder is provided to hold a specimen in the path of the electron beam. In addition, the microscope comprises a detector to detect the electron beam transmitted through the specimen. The transmission electron microscope of this embodiment is adapted to operate in a dark-field mode in which a zero beam of the electron beam is not detected.

In yet another embodiment, a transmission electron microscope comprises an electron beam source to generate an electron beam. Beam optics are provided to converge the electron beam, the beam optics defining an optic axis of the microscope along which there is substantial cylindrical symmetry of the beam optics. The microscope further comprises an aberration corrector comprising an element located approximately at the optic axis. The aberration corrector is adapted to correct the electron beam for at least a spherical aberration. A specimen holder is provided to hold a specimen in the path of the electron beam. In addition, the microscope comprises a detector to detect the electron beam transmitted through the specimen. The transmission electron microscope of this embodiment is adapted to operate in a dark-field mode in which a zero beam of the electron beam is not detected.

In still another embodiment, a transmission electron microscope comprises an incoherent electron beam source to generate an incoherent electron beam. Beam optics are provided to converge the electron beam. The microscope further comprises an aberration corrector to correct the electron beam for at least a spherical aberration. A specimen holder is provided to hold a specimen in the path of the electron beam. In addition, the microscope comprises a detector to detect the electron beam transmitted through the specimen. The transmission electron microscope of this embodiment is adapted to operate in a dark-field mode in which a zero beam of the electron beam is not detected.

In another embodiment, an electron beam component assembly for a transmission electron microscope comprises an electron beam source to generate an electron beam. An aberration corrector is provided to correct the electron beam for at least a spherical aberration. A detector is included to detect the electron beam after the electron beam has been transmitted through a specimen. In a transmission electron microscope, the electron beam component assembly is adapted to operate in a dark-field mode in which a zero beam of the electron beam is not detected.

In yet another embodiment, a dark-field aberration corrector for a transmission electron microscope comprises an aberration corrector to correct an electron beam for at least a spherical aberration. A dark-field aperture comprises a dark-field stop that has (i) a circular-disc stop with a substantially circular cross-section approximately at a radial center of the electron beam to stop a central portion of the electron beam; and (ii) an outer stop concentric with, and spaced from, the circular-disc stop, such that there is an annular gap between the circular-disc stop and the outer stop.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments and aspects of the transmission electron microscopes described herein and, together with the description, serve to explain the principles of the invention.

FIGS. 8A, 8B, and 8C are illustrations of results of a computer simulation that was carried out to demonstrate the efficacy of an exemplary embodiment of a charge-on-axis aberration-correcting objective lens assembly for use in an ADF-TEM.

FIG. 10 is a schematic diagram of an exemplary embodiment of a reference version of an ADF-TEM.

FIG. 11 is a schematic diagram of an exemplary embodiment of an implementation in which image constituents from a tilted and scanned electron beam are summed.

FIGS. 13, 14, 15, and 16 are schematic diagrams of various exemplary embodiments of implementation of incoherent superposition.

DETAILED DESCRIPTION

Figure 1A:
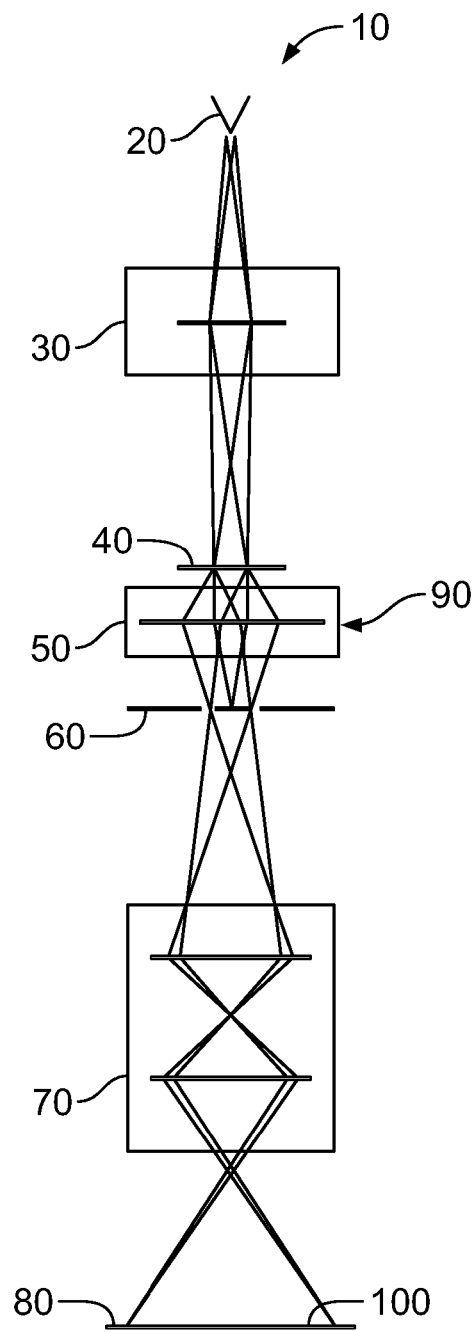
FIGS. 1A and 1B are schematic diagrams of exemplary embodiments of aberration-correcting ADF-TEM columns.

A transmission electron microscope (TEM) is able to image a specimen in parallel, thereby theoretically offering rapid and efficient throughput. As explained above, however, TEM imaging can be problematic when trying to resolve single point-like objects because the phase-contrast information in the image is typically not directly interpretable for this purpose. This problem may arise, for example, when trying to image single atoms or clusters of atoms in aperiodic arrangements on a specimen.

TEM imaging can be adapted to operate in a "dark field" mode in which a central beam (referred to as a "zero beam") of electrons in the electron beam of the microscope is blocked. Indeed, the dark-field mode may be implemented as a primary or dedicated image mode for the TEM. The dark-field mode can produce an image with monotonic contrast, which allows direct interpretability of the image to determine relative atomic weights. For example, the dark-field imaging can be used to obtain chemically sensitive projections of single atoms, clusters of atoms, or nanostructures. However, the dark-field mode may decrease the data throughput of imaging due to reduced electron dose, which taken alone may be undesirable. Thus, dark-field imaging techniques based on coherent illumination and suffering from spherical or other aberration may be undesirably slow.

In order to improve speed, TEM imaging may be adapted to correct for aberrations. Aberrations can be detected and a computer can be used to analyze the aberrations and apply compensating signals to aberration-producing lens elements. The aberration correction can provide increased throughput of imaging. Such increased throughput may be especially advantageous in using TEM for DNA sequencing. The high throughput may allow the microscope to be used in sequencing a full human genome substantially quickly. For example, the microscope may be adapted to sequence a full human genome in from about 200 hours to about 0.01 minutes, such as about 20 hours. In an especially high-throughput version, the microscope may be used in sequencing a full human genome in from about 10 hours to about 1 minute.

Thus, aberration correction may be implemented in a TEM that is also adapted to operate in the dark-field mode. As described further below, this combination may be especially advantageous when the aberration correction is implemented wholly or in part using "charge-on-axis" elements. "Charge-on-axis" refers to one or more elements placed approximately at the zero beam of the microscope. In a bright-field mode, in contrast, the zero beam would not be blocked by any such elements.

In addition, and also as described further below, one or more of the aberration correction and the dark-field mode may be further combined with incoherent illumination. As described herein, incoherent illumination may be generated by, for example, the use of a substantially incoherent electron source or shifting, scanning, or altering the energy of the electron beam. The combination of aberration correction, incoherent illumination, and dark-field operation may especially increase microscope throughput, at least in part due to an increased electron dose from incoherent illumination as compared with coherent illumination.

Reference will now be made in detail to exemplary embodiments of TEMs, which are illustrated in the accompanying drawings. Wherever possible, the same reference numbers will be used throughout the drawings to refer to the same or similar parts.

In an exemplary embodiment of a TEM, an electron gun together with condenser lenses and a pre-field of an objective lens form a patch of electron illumination on a specimen. The atoms of the specimen scatter the incident electrons, with the heavier atoms scattering the electrons to higher angles. The post-sample field of the objective lens creates a diffraction pattern in a back-focal plane of the objective lens.

In an approximately cylindrically symmetric system, the dark-field mode may be an "annular-dark-field" (ADF) mode. In this case, an aperture containing a central beam stop may be mounted in or near the back-focal plane (or a plane conjugate to it). The central beam stop may have the shape of a circular disc. The beam stop limits the scattered electrons to an angular range denoted here as $\phi_d$, which defines an annulus between an inner angle $\phi_1$ and outer angle $\phi_2$. These angles may be, for example, in the case of imaging clusters of atoms, from about 0.1 mrad to about 10 mrad for $\phi_1$, and from about 1 mrad to about 20 mrad for $\phi_2$. In the case of imaging single atoms, these angles may be, for example, from about 5 mrad to about 20 mrad for $\phi_1$, and at least about 20 mrad for $\phi_2$. An example of a suitable range for $\phi_2$ is from about 20 mrad to about 50 mrad. Thus, an example of a suitable range for $\phi_d$ for imaging single atoms may be from about 15 mrad to about 50 mrad. Electrons passing through this annular aperture are ultimately collected on a detector, generating an image of the specimen. In other words, the rays passing through the annular aperture are ultimately the source of the information gleaned from the specimen.

The primary contrast mechanism for ADF-TEM may be mass-thickness contrast, providing enhanced sensitivity to atomic number of the imaged species. The collected intensity (I) may follow approximately the relation:

$$I/I_0 = 1 - \exp(-N\sigma\rho t)$$

where $N = N_0 A$ is Avogadro's number divided by atomic weight A; $\sigma$ is the appropriate partial single-atom scattering cross-section dependent on atomic number Z, incident energy, and angular range; ρ is the materials density; and t is the thickness.

The intensity increases monotonically with thickness, allowing ready identification of relative atomic weights of species if thickness is constant. While dark-field TEM is chemically sensitive, however, its resolution may normally be compromised when used with conventional electron optical lenses. Since, in dark-field TEM, electron rays are mainly collected from higher angles, where the electron rays are more strongly affected by aberrations, the contrast may become delocalized and the resolution may be reduced. Thus, aberration correction may be especially desirable when implemented in a dark-field-mode microscope. Furthermore, an aberration-correction implementation that applies charge-on-axis to correct spherical aberration is inherently compatible with dark-field TEM because the beam stop of the aperture is located to intercept the path of rays proximal to the optic axis in the back focal plane of the objective lens.

An exemplary embodiment of the structural configuration of an aberration-correcting ADF-TEM is described below. This example of the aberration-correcting ADF-TEM has an electron optical column that includes an electron source, condenser lenses, a specimen holder, an objective lens, and a detector. In certain embodiments of the aberration-correcting ADF-TEM, the electron source may be a thermionic source, such as a tungsten (W) or lanthanum hexaboride ($LaB_6$) source. These sources may provide a substantially large current, which may be advantageous in allowing shorter exposures for each image and hence higher throughput. These examples of electron sources may not be as coherent as other sources. High coherence levels are not necessarily required, however, in aberration-correcting ADF-TEM. Indeed, significant advantages can result from deliberately incoherent illumination, as explained in more detail below.

The electron source may be followed by condenser lenses to form a beam that will be incident on the sample. The condenser lenses may consist of, for example, two, three, or four lenses. The condenser lenses may be magnetic or electrostatic. The electrons scattered from the specimen are then imaged through an optical system. The optical system may accomplish at least two functions. First, the optical system may block out the central scattered beam to implement the ADF mode. Second, the optical system may correct aberrations. The combination of these two features can be particularly advantageous.

The electromagnetic lenses can also include additional correcting elements near the axis. Furthermore, there is an opportunity for standard magnifying lenses to be included in the aberration-correcting dark-field TEM. These magnifying lenses are followed by an electron detector. The electron detector may have one of many forms that are known to one of ordinary skill in the art.

The combination of the objective lens and the aberration-correcting system may be advantageous. The objective lens may structurally resemble a conventional electrostatic or magnetic lens. As part of the aberration-correcting system, a charge-inducing component may be positioned at least partially on the optic axis of the ADF-TEM column (or a more conventional multipole-based aberration corrector), either before, in, or after the objective lens in relation to the beam path.

There exist alternative ways of introducing the charge-on-axis for the aberration-correcting ADF-TEM. For example, the charge-inducing component may be constructed of metal serving to define an equipotential. Alternatively, the charge-inducing component may be constructed of a substantially resistive material, such as a partially conductive material. In yet another embodiment, the charge-inducing component is an insulator that is charged up in a particular way either by the electron beam itself or otherwise. The charge-on-axis configuration may allow the shape of the electric field to be controlled so that all of the rays emanating from one point in the object and passing through this annular region are focused to a very tight spot in the image plane.

The ADF-TEM may also include a system to correct for parasitic aberrations, in contrast to spherical aberrations, whether parasitic aberrations are cylindrically symmetric aberrations or not. Parasitic aberrations may be caused, for example, by the optical elements having been machined in such a way as to be very slightly off-axis or very slightly non-round.

An example of the correction of parasitic aberrations will now be described. For low-order aberrations, namely up to second order, direct correction by appropriate rotatable multipole or dipole alignment coils may be provided (e.g. quadrupole stigmator for astigmatism and sextupole for threefold astigmatism). In a novel approach for mitigating third-order aberrations, the electron beam may be predistorted by a multipole element (quadrupole or octupole) before entering the aberration correcting element(s) and then undistorted by the same multipole element after the aberration correcting element(s). This process can induce a non-round third-order aberration that corrects the non-round parasitic aberration (two-fold symmetric in the case of a quadrupole (C32) and four-fold symmetric in the case of an octupole (C34)).

Fifth-order parasitic aberrations may be compensated by the misprojection of the correcting element(s) to an optical plane different from the back focal plane of the objective lens. This would allow propagation of the wave front to occur between the insertion of the aberration and its correction. This propagation causes a higher-order combination aberration whose sign depends on the sign of the misprojection.

This additional parasitic-aberration correction system can be advantageous in many embodiments of aberration-corrected ADF-TEM, particularly in many commercial applications, because parasitic aberrations have been an important constraint on the development of effective aberration-correction systems for about 40 years. The ability to correct these parasitic aberrations, therefore, may be a significantly advantageous feature of aberration-corrected ADF-TEM.

The charge-on-axis implementation may enable miniaturization of the dark-field TEM, among several other advantages. In some applications, however, the advantages of miniaturization may not be required and other considerations may even take precedence. Thus, alternatively to charge-on-axis implementations of the aberration corrector, other configurations of aberration correctors may be implemented.

In an example of such an alternative for an ADF-TEM, a standard aberration corrector may include a Nion Co. quadrupole-octupole corrector or CEOS Co. sextupole or quadrupole-octupole corrector. An annular aperture may be provided either in the incoming illumination of the sample (such as for a STEM mode of an ADF-TEM) or in the outgoing scattered beam (such as for an ADF-TEM mode).

The aberration-correcting dark-field TEM may additionally include a mechanism for diagnosing the aberrations. Conventional approaches for diagnosing aberrations typically assume that a bright-field image is available. One novel method for dark-field TEM is to acquire images as a function of illumination tilt and defocus, and to extract the blurring effect of the tilt and defocus. The blurring gives a value for the defocus and astigmatism at a variety of angles. This process can provide sufficient data to numerically compute an aberration function for the imaging system. A sample used for these purposes may contain single atoms or clusters of atoms, or may be another kind of sample made for the purpose of diagnosing aberrations. For example, the sample may be the specimen that is ultimately the subject of interest for study. Alternatively, the sample may be a sample used solely for calibration of the aberration-correcting TEM.

FIG. 1A is a schematic diagram of an exemplary embodiment of an aberration-correcting ADF-TEM column 10. Column 10 has an electron source 20, one or more condenser lenses 30, specimen 40, objective lens 50, annular aperture 60, one or more projecting lenses 70, and detector 80. A charge-on-axis aberration corrector 90 is incorporated in objective lens 50. Image plane 100 is shown in the figure. Electron source 20 and condenser lenses 30 are configured to provide a variety of illumination conditions. For example, electron source 20 and/or condenser lenses 30 may be adapted to provide a high-current, incoherent-illumination mode that achieves a unique synergy with the aberration-correction and ADF features of column 10.

Aberration-correcting ADF column 10 is connected to a power source that provides power to components of column 10, such as electron source 20, lenses 30, 50, and 70, aberration corrector 90, and detector 80, as well as a stage that holds and moves specimen 40. Column 10 may have a total power consumption of less than about 800 W. In a low-power embodiment, such as where column 10 is miniaturized, column 10 may even have a power consumption of less than about 300 W, such as from about 10 W to about 100 W. Electron source 20 may be adapted to generate an electron beam with a current of less than about 100 mA. In an especially low-current version, electron source 20 may even be adapted to generate an electron beam with a current of less than about 10 μA, such as less than about 10 pA.

In aberration-correcting ADF-TEM column 10 of FIG. 1A, aberration-correcting objective lens 50 is internally corrected by charge-on-axis corrector 90. In other words, the aberration correction is performed inside the objective lens module. Locating charge-on-axis corrector 90 inside objective lens 50 may be advantageous in reducing the size of the EM column, which may otherwise be made unnecessarily large by an additional stack of corrective elements. Annular aperture 60 may be inserted in or near the back focal plane of objective lens 50. Annular aperture 60 may also be positioned in any plane that is conjugate to the back focal plane of objective lens 50.

Figure 1B:
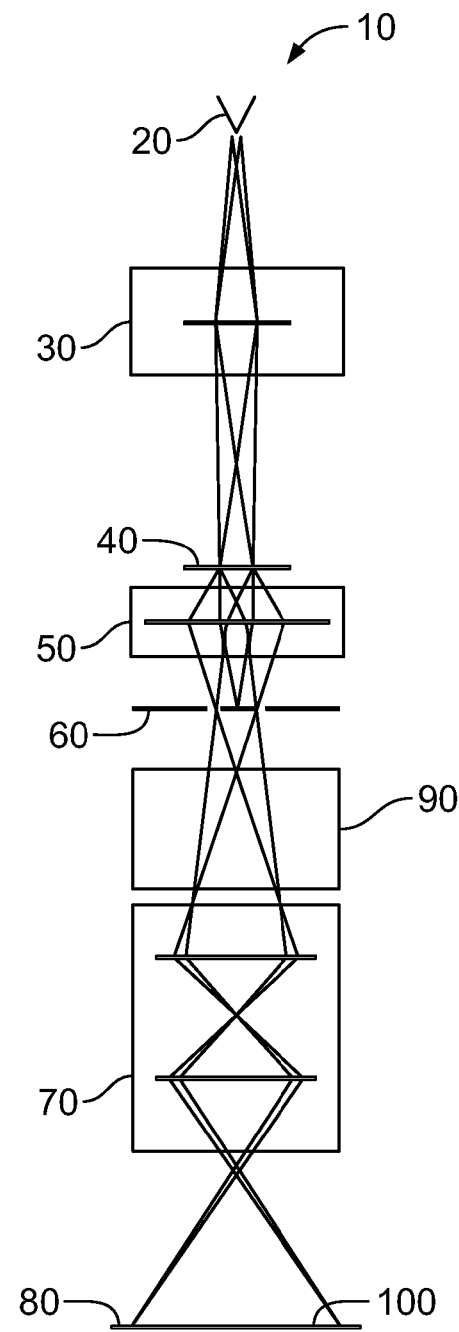

FIG. 1B is a schematic diagram of an exemplary variation of the embodiment of FIG. 1A, with charge-on-axis corrector 90 situated outside of objective lens 50. This configuration can be constructed using, among other parts, commercially-available components.

Figure 2A:
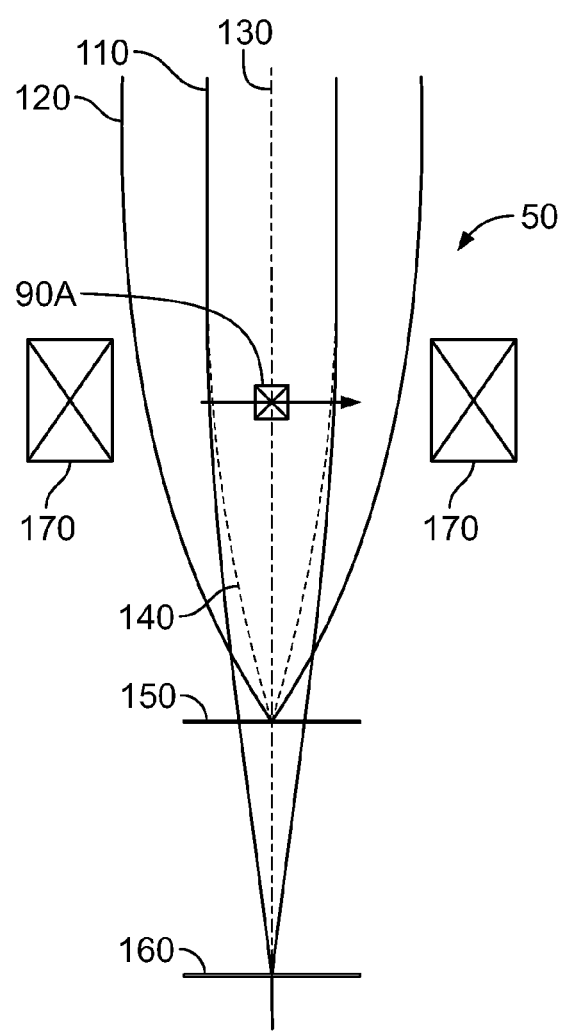
FIGS. 2A, 2B, 2C, 2D, 2E, and 2F are schematic diagrams of electron optical rays in various exemplary embodiments of an aberration-correcting ADF-TEM column.

FIG. 2A is a schematic diagram of an exemplary embodiment of objective lens 50 of the aberration-correcting ADF-TEM with charge-on-axis aberration corrector 90A, showing electron optical ray paths 110, 120. Parallel incident rays are shown in order to illustrate the effect of the aberration correction, although the lens would not typically be operated with incident rays in parallel. In practice, objective lens 50 is used to produce a magnified image of the illuminated specimen. Also shown are optic axis 130, central rays 110, peripheral rays 120, corrected central ray 140, corrected Gaussian focal plane 150, and uncorrected Gaussian focal plane 160. Lens elements 170 of objective lens 50 are shown as schematic objects and represent, for example, either the pole-pieces and coils of a magnetic lens or the electrodes of an electrostatic lens.

Charge-on-axis aberration corrector 90A is positioned along optic axis 130. In one embodiment, objective lens 50 is disposed around charge-on-axis aberration corrector 90A, such that charge-on-axis aberration corrector 90A is positioned between lens elements 170. Aberration corrector 90A provides a modified potential distribution that causes rays that are closer to the center of the beam, namely central rays 110, to be focused to the same point as peripheral rays 120, which are rays farther from the center of the beam.

Charge-on-axis aberration corrector 90A can be a metal cylinder, among many possible forms, connected to a power supply. Associated with charge-on-axis aberration corrector 90A, there may be additional electrodes to establish the desired electrostatic fields. The combination of such an additional electrode and charge-on-axis aberration corrector 90A is referred to as a foil lens. When aberration corrector 90A is absent, the spherical aberration of objective lens 50 causes rays that are near the center of the beam, namely central rays 110, to be focused less strongly to second Gaussian focal plane 160, than rays far from the center of the beam, namely peripheral rays 120, which focus a shorter distance to first Gaussian focal plane 150.

Applying an electric potential to aberration corrector 90A provides a lateral force to passing electron beam rays, causing the rays to deflect. This force more strongly affects rays passing closer to the center of the beam, causing them to focus nearer to the focal point than rays far from optic axis 130. When peripheral rays 120 and central rays 110 are focused to a common point by the combination of objective lens 50 and charge-on-axis aberration corrector 90A, for example to first Gaussian focal plane 150, the effect of spherical aberration is mitigated or canceled.

Figure 2B:
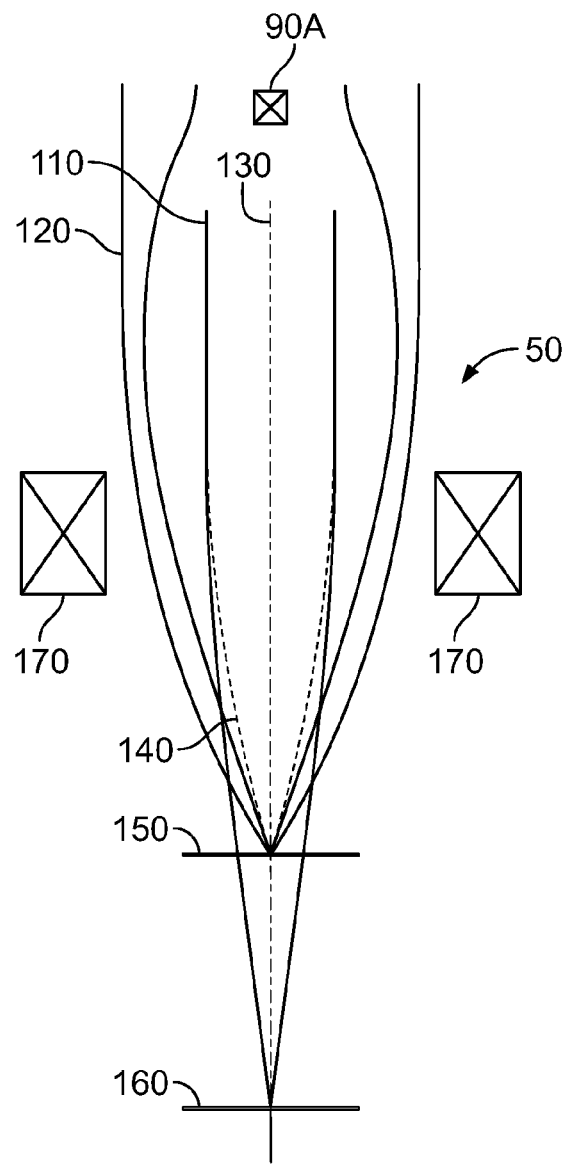

FIG. 2B is a schematic diagram of an exemplary variation of the basic aberration-correcting ADF-TEM configuration shown in FIG. 2A. In this case, aberration corrector 90A is placed outside of objective lens 50. In this way, aberration corrector 90A does not interact with the field of lens elements 170. This positioning of aberration corrector 90A pre-aberrates central rays 110, as shown at the top of the figure. In this way, central rays 110 ultimately become focused to the same point as peripheral rays 120.

The particular configuration of aberration corrector 90A shown in FIG. 2B can allow peripheral rays 120 to focus approximately to their original focal point, although this is not necessarily required. The configurations shown in FIGS. 2A and 2B affect peripheral rays 120 as well as central rays 110, but in the proper proportions, causing them to focus to the same point on Gaussian focal plane 150. This orientation and positioning of aberration corrector 90A thus affects central rays 110 and peripheral rays 120, in the correct proportion and causes all the rays to focus at a single point at Gaussian focal plane 150. Corrected Gaussian focal plane 150 may occupy any position after the lens.

Figure 2C:
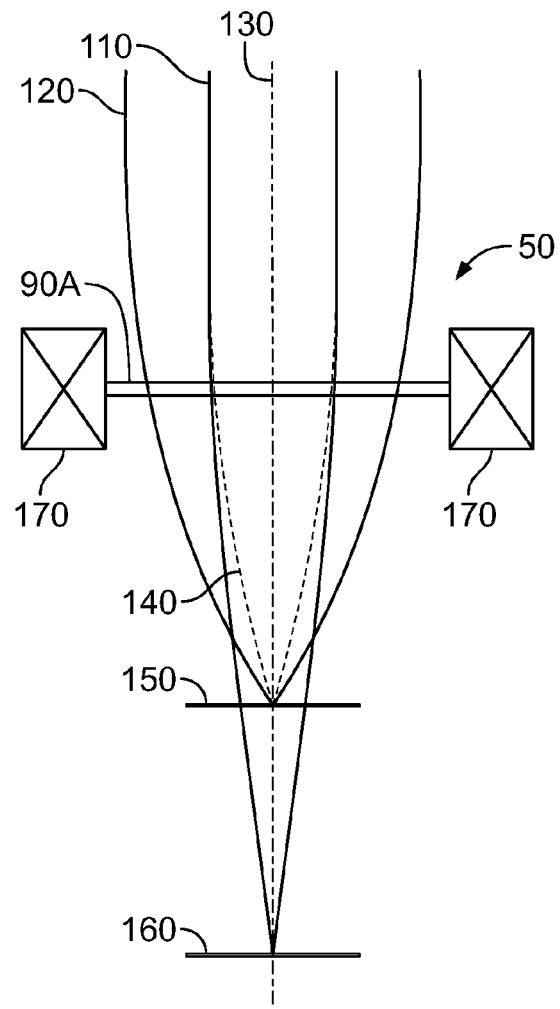

FIG. 2C is a schematic diagram of an exemplary variation of the basic aberration-correcting ADF-TEM configuration shown in FIG. 2A, where charge-on-axis aberration corrector 90A is extended in the dimensions perpendicular to optic axis 130, such that an element takes the form of a foil, such as a conductive grid. This configuration of objective lens 50 and charge-on-axis aberration corrector 90A can have approximately the same effect as the forms of charge-on-axis aberration corrector 90A previously depicted in FIGS. 2A and 2B. However, the alternative configuration of charge-on-axis aberration corrector 90A shown in FIG. 2C may be supported structurally more easily or in a more sturdy manner than separate aberration corrector 90A shown in FIGS. 2A and 2B. The foil form may be preferable for imaging point objects, in contrast to general imaging such as imaging of highly periodic objects. A foil form of aberration corrector 90A may be thin enough to be transparent to the charged particles. Additionally, a grid may need to be fine enough so that the distortion of the equipotential in each hole does not detrimentally affect the resolution.

The metal used to produce the foil form of aberration corrector 90A may be capable of being rendered sufficiently thin for this application. Any metal foil may, in principle, be functional in this aberration-correcting ADF-TEM column although there may be advantages to metals that do not scatter strongly and can be fabricated into thin foils that are self supporting. A typical range for the thickness of the foil is from about 0.1 nm to about 10 nm, such as from about 2 nm to about 6 nm. For this reason, a wide variety of foil forms of aberration corrector 90A can be considered. A form can be selected among these to best suit the anticipated needs of a particular application for the aberration-correcting dark-field TEM.

Virtually any foil can be selected, as well as alloys, such as for example gold, silver, platinum, titanium, copper, and iron. Foils with higher tensile strength can be employed for ease of manufacture and robustness in handling. In some cases, less expensive foil members can be employed, depending on the intended application and the constraints of the production budget. Ease of handling and resistance to material fatigue may also be considered to limit production costs. The foil may be so thin that it may be desirable to have the support of a metal grid that acts as a scaffold. The ADF-TEM imaging mode may allow for the region close to the optic axis to be used to provide robust mechanical support without having a deleterious effect on the ADF-TEM image.

Figure 2D:
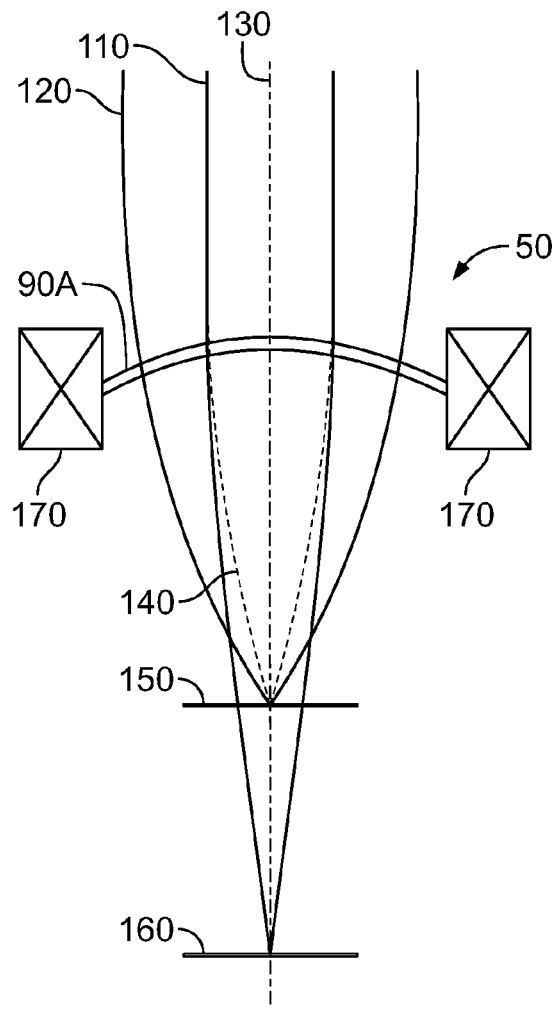

FIG. 2D is a schematic diagram of an exemplary variation of the foil form of aberration corrector 90A shown in FIG. 2C. In this case, however, the foil form is altered in shape to match the desired modification of the wave front to provide the desired aberration correction. Again, the dark-field imaging mode may allow the center of the foil to be supported. Thus, the control of the geometry may be more predictable than if the entire angular range needed to be as transparent as possible.

The result can be further improved by selecting the metal for the foil. For example, shape-retaining metal or transforming metal with shape memory can be employed. In this manner, the aberration-correcting ADF-TEM can be used multiple times. A changed temperature can be used to reconfigure foil aberration corrector 90A to the shape needed for a particular application. Thus, the aberration-correcting ADF-TEM configurations shown in FIGS. 2C and 2D could be switched between without having to manually substitute one of aberration corrector 90A for the other.

Figure 2E:
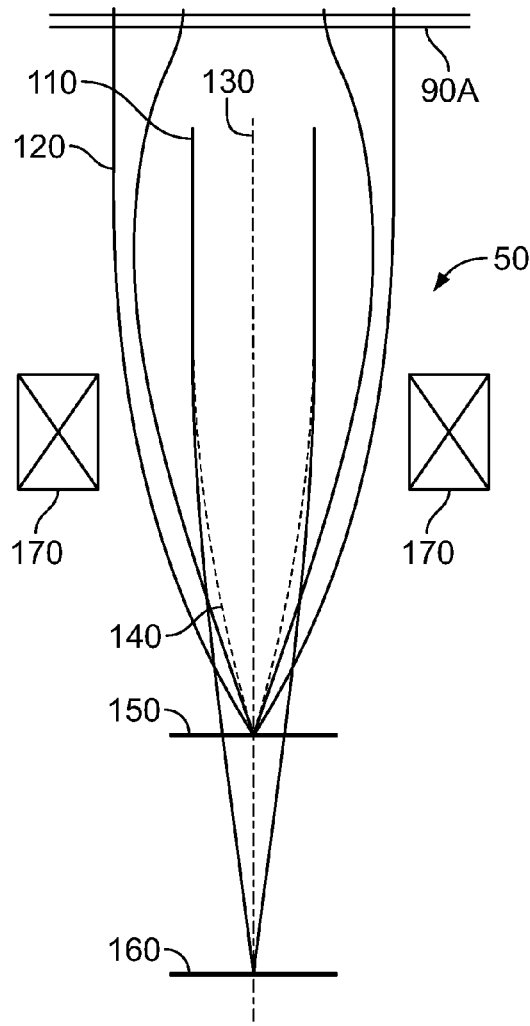
Figure 2F:
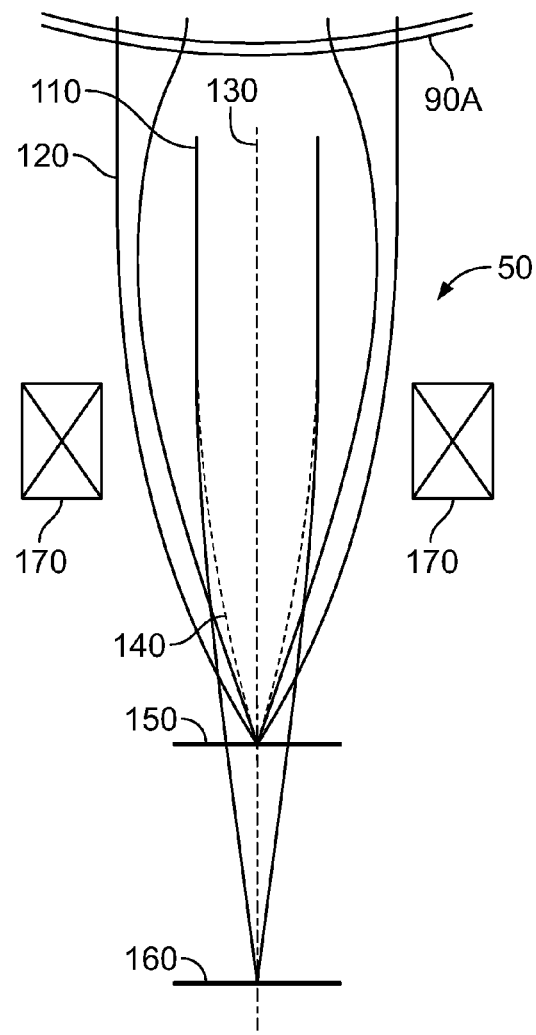

In the case shown in FIG. 2D, a spherical aberration is to be corrected. There may be variants of each of FIG. 2C and FIG. 2D that are similar to FIG. 2B in that aberration corrector 90A is outside of objective lens 50. FIG. 2E is a schematic diagram of such an exemplary variation of the embodiment of the aberration-correcting ADF-TEM shown in FIG. 2C. In this embodiment, the flat foil form of aberration corrector 90A is placed outside of objective lens 50. FIG. 2F is a schematic diagram of an exemplary variation of the embodiment of the aberration-corrected ADF-TEM shown in FIG. 2D. In this embodiment, the curved or shaped foil form of aberration corrector 90A is placed outside of objective lens 50.

Figure 2G:
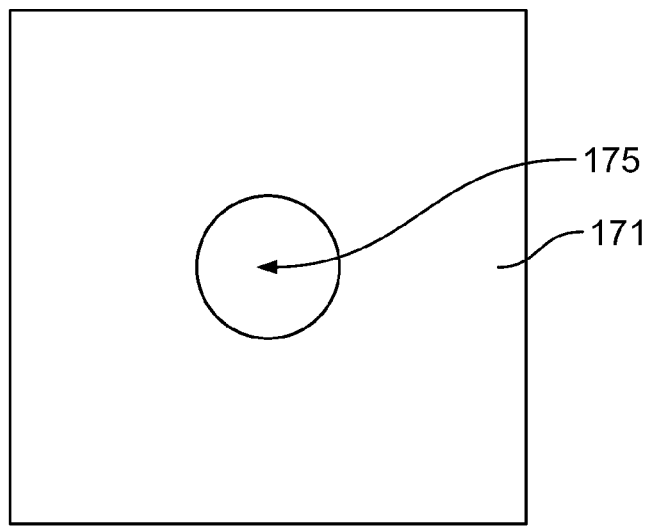
FIGS. 2G and 2H are schematic diagrams of an exemplary embodiment of a foil corrector of an aberration corrector.
Figure 2H:
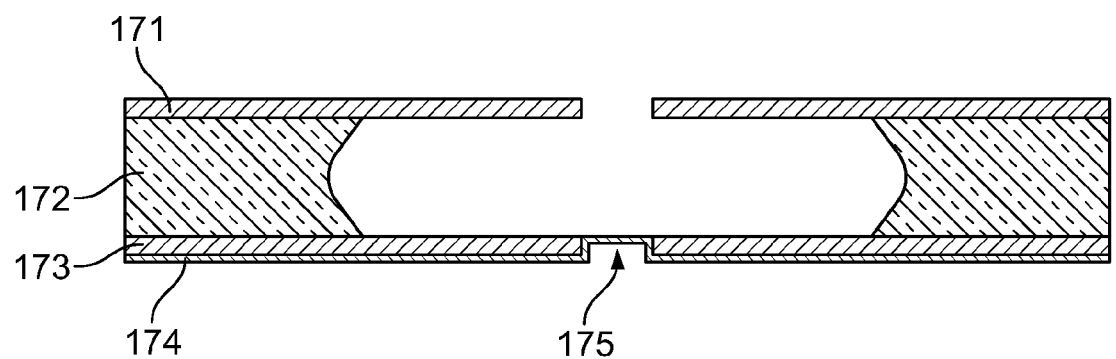

In one version, the foil form of aberration corrector 90A includes a foil across the beam path and an aperture in a different plane, the foil and aperture being adapted to receive independent electric potentials. FIGS. 2G and 2H illustrate top and side views, respectively, of the construction of an exemplary embodiment of a foil corrector. This foil corrector includes metal layers 171 and 173, an insulating layer 172 and a thin conducting electron-transparent foil 174. Aperture 175 is also shown in the figure. Metal layers 171 and 173 are made of a metal, such as for example copper. Insulating layer 172 may be a thick quartz sheet. In one example, insulating layer 172 has a thickness of about 50 micrometers. During fabrication, insulating layer 172 may be prepared with standard lithographic techniques so as to leave two aligned apertures, one on either side of the quartz sheet. Metal layers 171 and 173 may then be deposited on insulating layer 172. A thin film of carbon may then be deposited on metal layer 173 and exposed insulating layer 172. A vapour acid etch (such as hydrofluoric acid) can then be used to gently remove a portion of insulating layer 172 through the uncovered aperture. This etch leaves a free-standing film of carbon that is extremely thin and therefore fulfills criteria of being electron-transparent and consisting of low-Z elements that may be desirable for foil 174.

Both metal layers 171 and 173 and foil 174 may have openings with diameters of from about 1 µm to about 100 µm. Insulating layer 172, meanwhile, may have an opening with a diameter of from about 1 µm to about 600 µm. Where foil 174 spans aperture 175, foil 174 may have a thickness of from about 5 nm to about 1000 nm. Alternatively, foil 174 may be as thin as a monolayer of suitable material, such as graphene. In this latter case, insulating layer 172 may have a thickness of from about 1 µm to about 1000 µm while metal layers 171 and 172 may have a thickness of from about 1 nm to about 1000 µm.

Each of the configurations shown in FIGS. 2B-2H ideally focuses electron beam rays that emanate from one point on a specimen down to approximately one point in image plane 160 formed by objective lens 50.

Figure 3A:
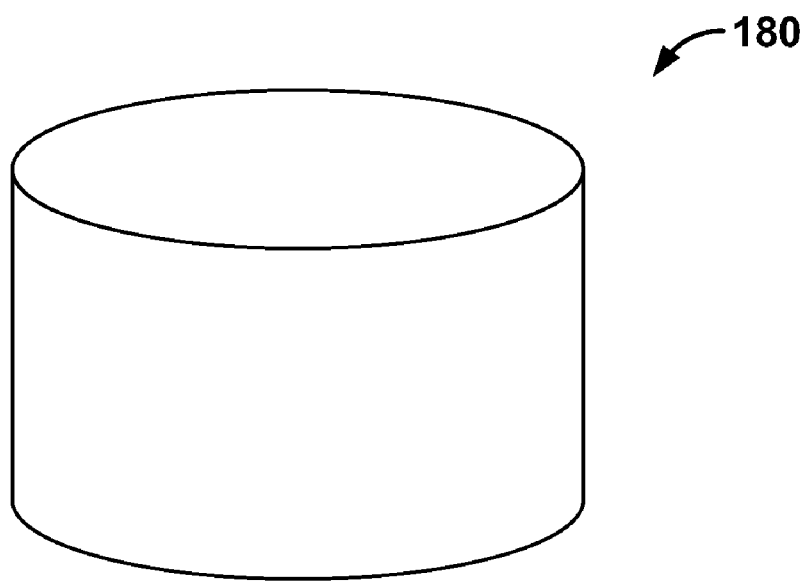
FIGS. 3A, 3Ai, 3B, 3Bi, 3Bii, 3C, and 3Ci are perspective views of various exemplary embodiments of charge-on-axis elements for an aberration-corrected ADF-TEM.
Figure 3A:
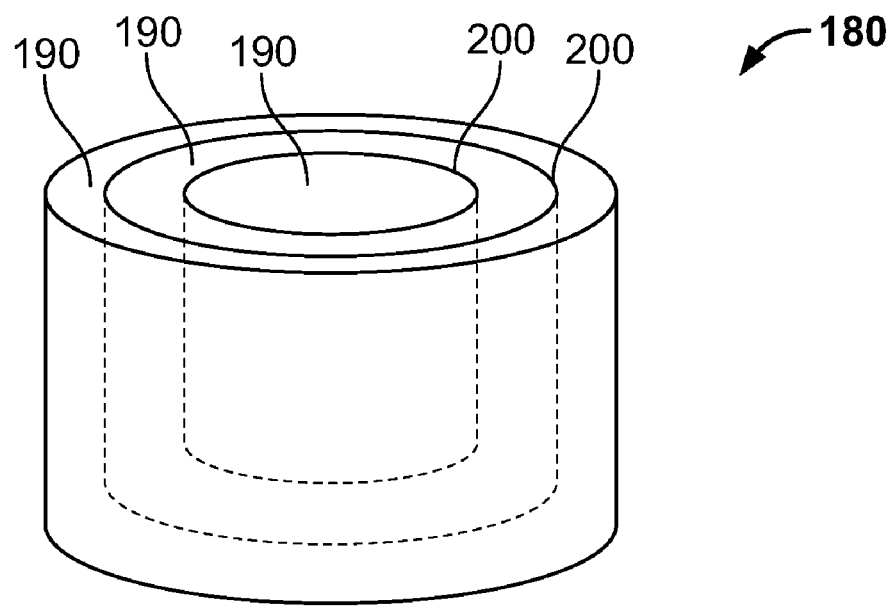

FIG. 3A is a perspective, simplified view of an exemplary embodiment of an element 180 of charge-on-axis corrector 90A of the aberration-correcting ADF-TEM. In this embodiment, the charge regions are continuous and arranged in one monolithic piece. The materials used to produce element 180 can be selected using the constraints that the materials must be robust enough mechanically and in terms of resistance to the electron irradiation, have a conducting surface (or near surface layer), and be amenable to fabrication into the desired geometry. This may include metals such as platinum, titanium, molybdenum, and gold, but also semiconductors like doped silicon and gallium arsenide. It would also include composite structures of an insulator, such as silicon nitride that is coated with a thin metal layer.

The size of element 180 may range from about 1 nm to about 10 cm in diameter, with an overall depth ranging from about 10 microns to a few centimeters. The conductivity of the surface of element 180 may be sufficient such that, when element 180 is connected to the microscope ground, there is substantially no evidence in the image that the resistivity of element 180 is causing time-dependent changes in the image.

Figure 3C:
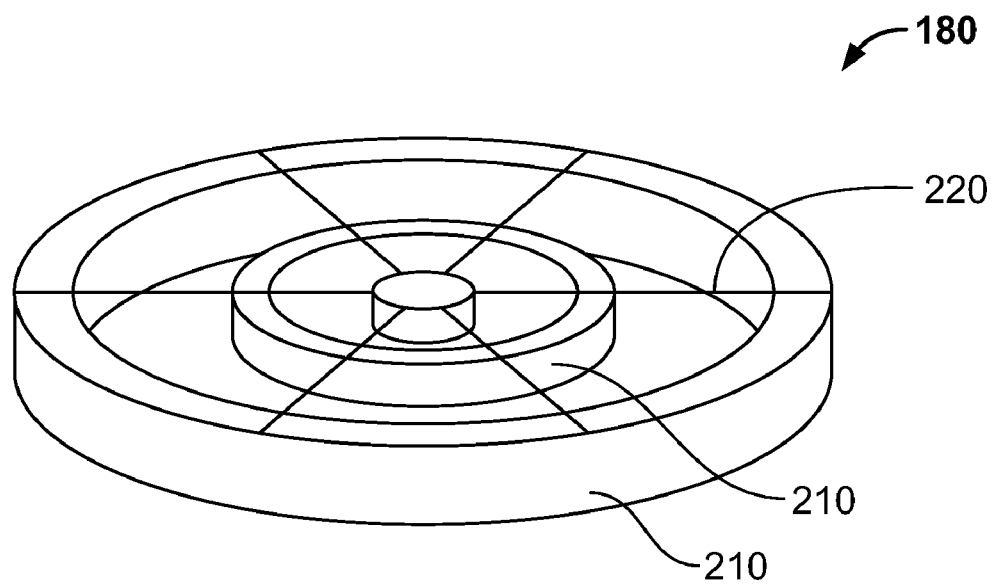
Figure 3C:
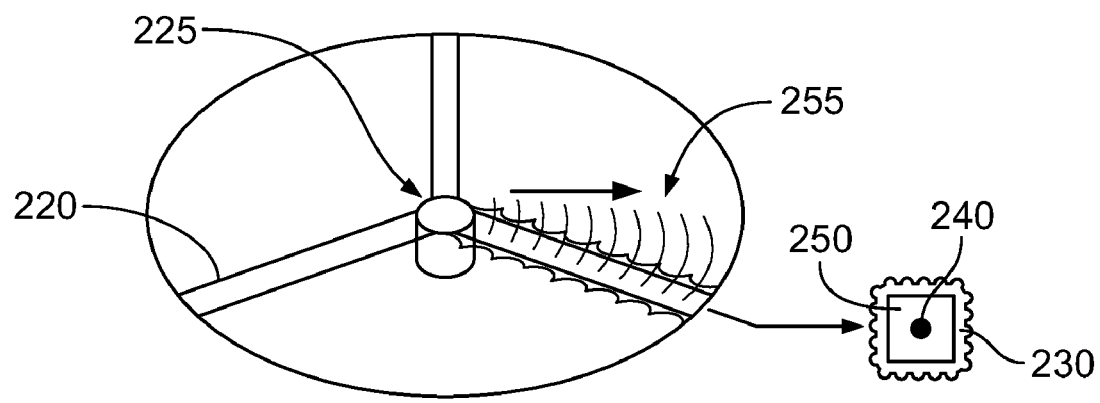

FIGS. 3A, 3Ai, 3B, 3Bi, and 3Bii are perspective, simplified views of exemplary embodiments of various approaches to configuring electrodes together to form element 180 of charge-on-axis corrector 90A. These configurations of charge-on-axis element 180 achieve different field distributions in the vacuum where the electrons travel. Embodiments of elements 180 in these figures may need to be mechanically supported, such as shown in FIG. 3C. All of the geometries shown may optionally be augmented by a thin resistive foil (such as a few nanometers thickness of amorphous carbon) in a plane perpendicular to the optic axis and mechanically supported by charge-on-axis element 180 to further constrain the shape of the equipotentials and thus more precisely achieve the desired particle trajectories. In one version, charge-on-axis corrector 90A is made up of a total of from 1 to about 20 distinct parts. In a more particularized version, charge-on-axis corrector 90A is made up of a total of from 2 to 3 distinct parts.

FIG. 3Ai illustrates a variant of the aberration-corrected ADF-TEM in FIG. 3A in which element 180, while still a cylinder in total form, is made up of multiple charge regions that are concentric. In this example, three charged regions 190 are separated by two insulators 200. Different charge values are placed on each of different charge regions 190.

FIG. 3B is a variant on the aberration-corrected ADF-TEM embodiment shown in FIG. 3A in which monolithically configured charge-on-axis element 180 is cylindrically symmetric but has a shaped profile, in this case a straight line.

FIG. 3Bi illustrates a variant of charge-on-axis element 180 shown in FIG. 3B with the multiple charge region features of FIG. 3Ai. This takes the form of three nested cones of diminishing sizes with different voltages.

FIG. 3Bii illustrates a variant of charge-on-axis element 180 shown in FIG. 3Bi. In this case, charge-on-axis element 180 has curved, rather than straight, sides. Again, charge-on-axis element 180 has a coaxial form, with multiple charged conductors 190 and insulators 200 therebetween.

FIG. 3C illustrates yet another variant of charge-on-axis element 180, this time having concentric distributed charges on individual rings 210 suspended in space by a web of spoke supports 220. Individual rings 210 radiating out from the optic axis having different electric potential values on them to produce a distribution of charges about the optic axis. One or more of spoke supports 220 may additionally be used to deliver charges to each of independent rings 210.

Spoke supports 220 may be constructed of a conductor, such as metal, or an insulator. For metal, the electric potential on spoke supports 220 may be of one value the entire way along the length of the spoke. If spoke supports 220 are constructed of an insulator material, on the other hand, spoke supports 220 may charge up. In a preferred embodiment, spoke supports 220 include insulators (which may surround a conductor) coated with another layer of material through which a current can flow down the potential gradient to establish a desired shape of the equipotentials.

These configurations provide other possibilities for providing charge-on-axis. Another way of introducing the charge-on-axis is an electrostatic mirror. However, the electrons may come to a standstill using this system after being decelerated by the field. As a result, the electrons may become very sensitive to stray fields.

An oblique electrostatic minor may be another way of providing charge-on-axis aberration correction.

FIG. 3C illustrates several concentric electrodes centered on the optic axis. This construction may resemble a zone plate. In this case, piecewise aberration correction but not complete aberration correction can be performed such that only correction of rays with large angles is achieved. In this case, a number of electrodes are provided with gaps therebetween. In each of the gaps, the local field provides aberration correction to the rays passing through the gap. The result is that at least a substantial fraction of the electrons passing through these gaps will contribute positively to the intensity of the image.

FIG. 3Ci illustrates an aberration-correcting ADF-TEM embodiment adapted to provide a shaped potential distribution using a single power supply. One example of a solution is to provide a central charge-on-axis element 225 supported by spoke supports 220 that are electrically conductive and also have a coating 230. Coating 230 may be made of a resistor that is specifically graded or has a changing thickness so that the electric potential drops in a functionally correct way as a function of radial distance from central charge-on-axis element 225 to achieve the desired electric potential distribution, as shown by equipotential lines 255 in the figure. Alternatively, coating 230 may be made of a conductor to achieve a similar effect.

Spoke supports 220 in many embodiments of the aberration-correcting ADF-TEM may be substantially complex. For example, spoke supports 220 may contain a conductor 240 in the middle, an insulator 250 outside of conductor 240, and then coating 230 on the very outside as shown in the exploded cross-section in FIG. 3Ci. This combination of conductor 240, insulator 250, and coating 230 may advantageously be used to provide the correct electric field distribution.

This approach to correcting aberrations in the aberration-correcting ADF-TEM may also be used to correct for parasitic aberrations. For example, there exists an aberration referred to as the C32 aberration that comprises a lack of cylindrical symmetry of spherical aberration. For the sake of reference, a pure spherical aberration, such as the C30 aberration, is cylindrically symmetric. The C32 aberration, however, describes how an otherwise spherical aberration (in the case of C30) is two-fold symmetric. To correct the parasitic aberration referred to as the C32 aberration, a multipole lens called a quadrupole may be installed before aberration corrector 90A. An additional quadrupole lens may be installed after aberration corrector 90A.

The effect of this C32-correcting configuration is to pre-distort the electron beam. In this case, the beam goes through the correcting lens, and the main distortion is eliminated after the correcting lens, leaving behind an approximate ellipticity to the spherical aberration. This system modification provides a C32 correction and a round beam.

To correct C34 aberration, or four-fold astigmatism, octupole lenses can be employed in the same manner, namely one before and one after aberration corrector 90A. For example, FIG. 2A shows spherical aberration corrector 90A between lenses 170. Many configurations are possible for the octupole lens. For example, the octupole lens may be positioned before lens elements 170, between lens elements 170, or after lens elements 170, similarly to charge-on-axis aberration corrector 90A in FIGS. 2A and 2B, which could be above or below lens elements 170.

Figure 4A:
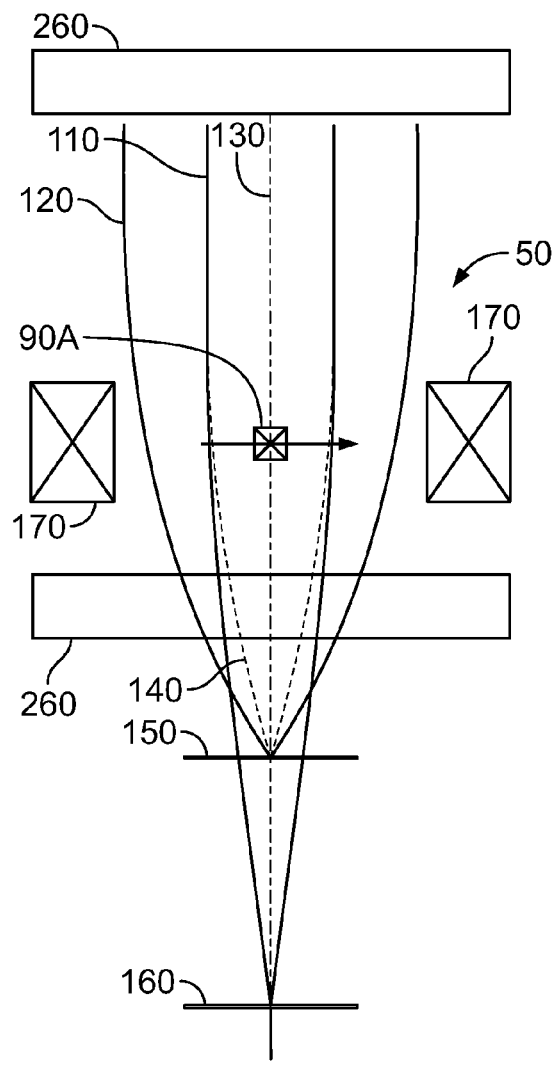
FIGS. 4A and 4B are schematic diagrams of exemplary embodiments of components for correcting parasitic aberrations in an ADF-TEM column.

FIG. 4A is a schematic diagram of an exemplary embodiment of components for correcting parasitic aberrations in an ADF-TEM column. In addition to basic aberration corrector 90A described above, additional multipole parasitic-aberration correcting elements 260 can be positioned before and after lenses 170. This configuration may be provided to correct parasitic aberrations.

Additional aberration-correcting elements 260 can be very important in many embodiments of the aberration-corrected ADF-TEM system, particular in many commercial applications. These parasitic aberrations held aberration correction back for about 40 years; thus, the ability to correct parasitic aberrations may be a significant advantage of the present aberration-correcting ADF-TEM. The aforementioned approaches provide examples of corrections to the third-order parasitic aberrations. The remaining off-axial aberration, namely coma, may be eliminated by a straightforward dipole shift of the beam with respect to a lens.

Figure 4B:
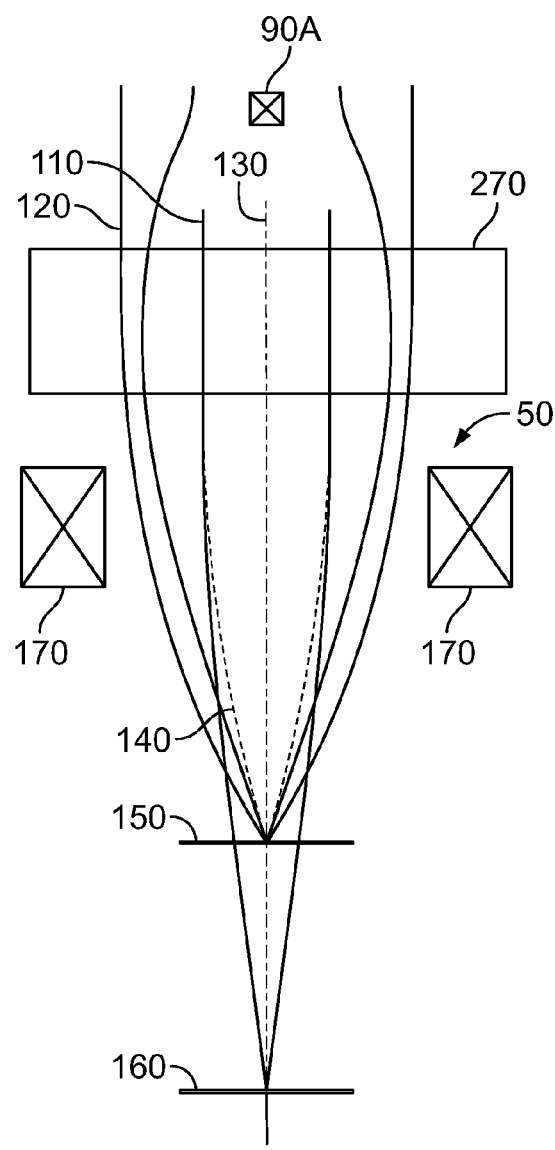

FIG. 4B is a schematic diagram of an exemplary embodiment of components for correcting fifth-order parasitic aberrations in an aberration-correcting ADF-TEM column. In this fifth-order aberration-correcting configuration, additional projecting lenses 270 are situated between charge-on-axis corrector 90A and lenses 170.

Projecting lenses can also be utilized in an additional approach. In the case of a negative third-order function and a positive third-order function, these functions may substantially cancel each other. However if there is a negative third-order component, and it is allowed to propagate for a distance and then cancel, the result is that the primary third-order component cancels, and a fifth-order component occurs. By determining the sign of that distance, the fifth-order aberrations can be controlled.

Figure 5:
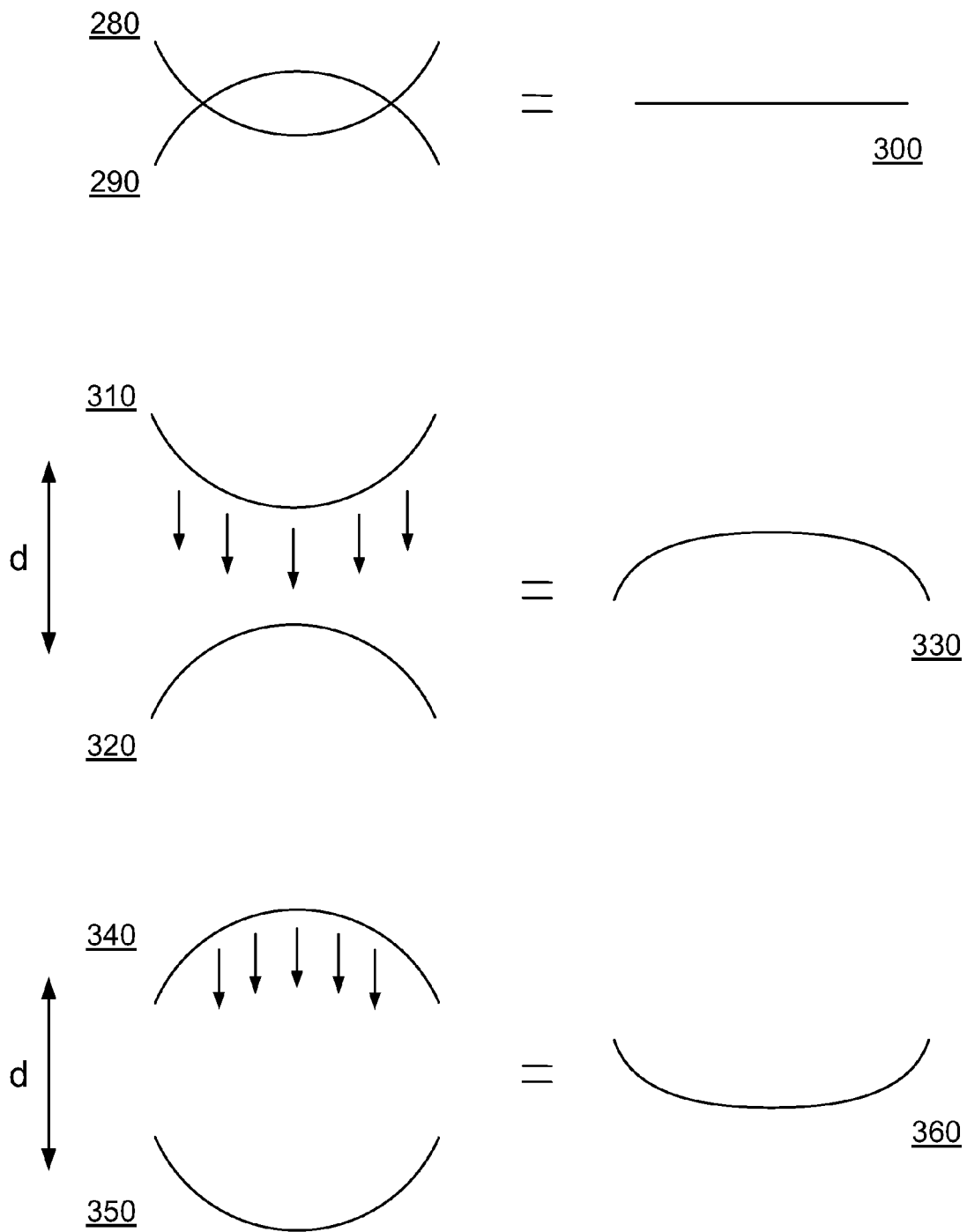
FIG. 5 is a schematic diagram illustrating how the misprojection of the third-order correction provides a fifth-order compensation.

FIG. 5 is a schematic diagram illustrating how the misprojection of the third-order correction provides a fifth-order compensation. When wavefronts 280 and 290 with third-order shaping of opposite sign are superimposed in the same plane, they cancel and generate a flat wavefront 300. However, when a wavefront with positive third-order curvature 310 is allowed to propagate over drift distance d and is then shaped using a negative third-order curvature 320, the superposition is a wavefront with negative residual fifth-order shaping 330. Analogously, when a wavefront with negative third-order curvature 340 is separated by a drift distance d from a positive third-order curvature 350, a wavefront with positive residual fifth-order shaping 360 is generated.

Figure 6:
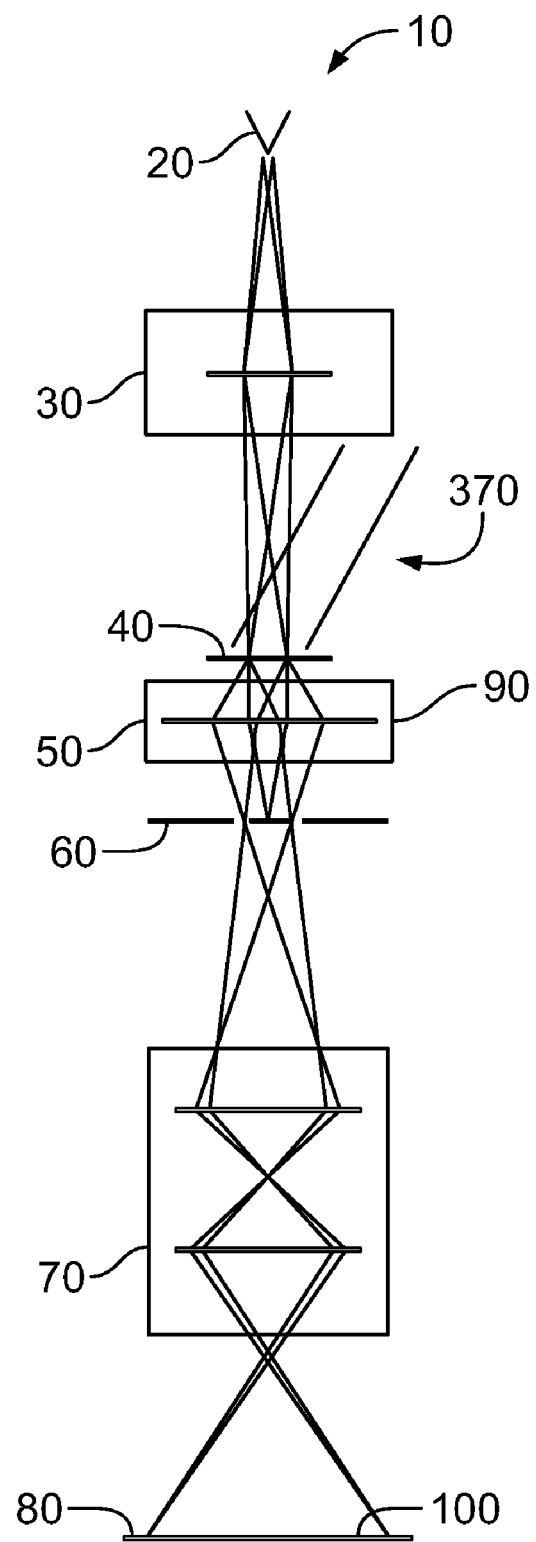
FIG. 6 is a schematic diagram of an exemplary embodiment of an aberration-correcting ADF-TEM system capable of providing a mechanism for aberration diagnosis.

FIG. 6 is a schematic diagram of an exemplary embodiment of an aberration-correcting ADF-TEM column capable of providing a mechanism for aberration diagnosis. Illumination tilt 370 is provided prior to specimen 40. For example, the beam may be tilted by two pairs of suitably placed and excited dipole deflectors (either magnetic or electrostatic) (not shown). An image may then be acquired in the ADF-TEM mode in focus, under-focus, and over-focus for each of a variety of tilts. This approach provides an image that is relatively unblurred, as well as two images that have known blurring. Afterward, the blurring function is deconvolved out. The results of these measurements provide the local defocus and astigmatism at each tilt angle. From this data, the aberration function can be deduced.

The various methods described above provide for correction of the main spherical aberration, which is third-order, as well as correction of the parasitic aberrations and some control of the fifth-order aberrations. In total, these innovative methods of aberration correction provide a finely focused ADF-TEM image, by providing both a means for measuring the aberrations and an apparatus for applying aberration correction.

Figure 7:
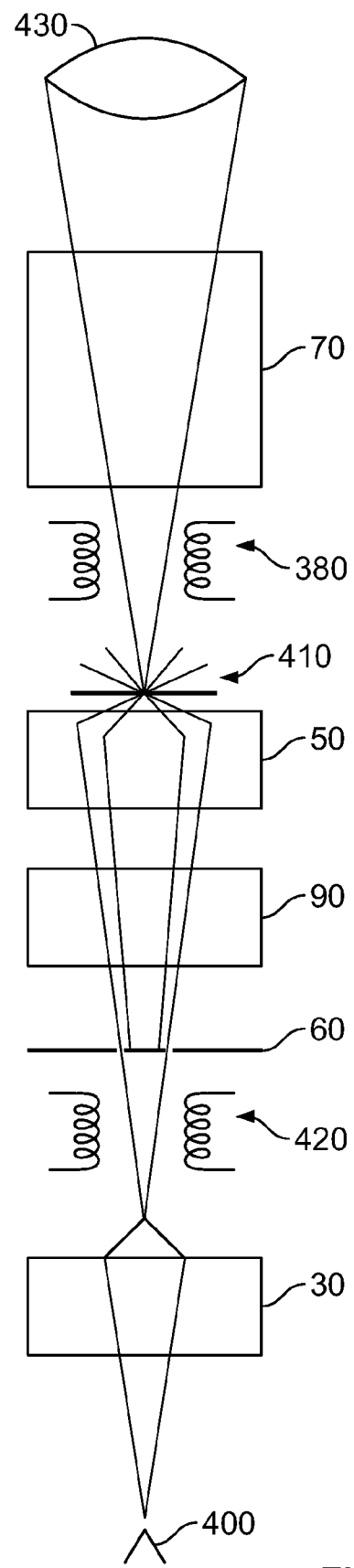
FIG. 7 is a schematic diagram of an exemplary embodiment of a STEM mode of an ADF-TEM column.

The electron microscope described may also be configured in a scanning transmission electron microscope (STEM) configuration to achieve a similar imaging outcome. FIG. 7 is a schematic diagram of an exemplary embodiment of a STEM mode of the aberration-correcting ADF-TEM that can be implemented by the assembly of commercially available components. This STEM mode is formally optically equivalent pixel by pixel to aberration-correcting ADF-TEM 10 illustrated in FIG. 1A by the principle of reciprocity. In the ADF-STEM mode, source 400 corresponds to TEM detector 80 in FIG. 1A, and similarly the detector 430 corresponds to TEM source 20 in FIG. 1A. The electron beam travels upward from source 400 through condenser lenses 30 and passes through annular aperture 60, corrector (not shown), and objective lens 50. Objective lens 50 forms a collimated hollow conical probe on sample 410. The electrons then scatter from sample 410, forming a diffraction pattern that may be collected by a projection system 70 that can be used to adjust the magnification of the diffraction pattern onto detector 430. Detector 430 comprises a set of concentric rings and a center detector to collect rays scattered to different angles and provide an intensity signal. Scan coils 420 are excited with ramp waveforms, causing the collimated probe to be scanned across the sample and thereby producing an intensity signal at the detector unique to the location of the probe on the sample. Descan coils 380 may be used to de-scan the beam symmetrically to the scan coils in order to restore the diffraction pattern to the optical path and prevent distortion. In this case, incoherence is provided by a large on-axis detector (this detector would be a bright-field detector if there were any bright-field electrons to detect). Although it is likely to be slower at collecting images, this STEM mode will have other advantages such as enabling simultaneous STEM ADF-TEM, a type of annular bright field and a very high-angle annular dark field with hollow cone illumination. A high-brightness gun may allow this mode to operate faster.

The features described herein for the aberration-correcting dark-field TEM may be implemented in many different types of microscopes utilizing charged ions or other particle beams. Moreover, the aberration-correcting dark-field TEM may be used in any suitable facility in any desired arrangement, such as networked, direct, or indirect communication arrangements.

Furthermore, the aberration-correcting dark-field TEM system may include any quantity of components, such as microscopes, machine managers, computer systems, networks, and image stores, that may be in communication with or coupled to each other in any suitable fashion, such as wired or wireless, over a network such as WAN, LAN, or Internet, directly or indirectly coupled, local or remote from each other, via any communications medium, and utilizing any suitable communication protocol or standard.

The embodiments of aberration-correcting dark-field TEM described herein may be implemented with either electrostatic or magnetic components. For example, for a commercial setting, a relatively small electrostatic version of the aberration-correcting dark-field TEM may be constructed. The aberration-correcting dark-field TEM system may include any quantity of electrostatic or magnetic components, such as electron or other particle gun, lenses, dispersion device, stigmator coils, reflected and discharged electron detector units, and stages, arranged within or external to the aberration-correcting dark-field TEM in any suitable fashion. Image stores, files, and folders used by the aberration-correcting dark-field TEM system may be of any quantity and may be implemented by any storage devices, such as memory, database, or data structures.

The aberration-correcting dark-field TEM may include a controller. The controller may include any one or more microprocessors, controllers, processing systems and/or circuitry, such as any combination of hardware and/or software modules. For example, the controller may be implemented in any quantity of personal computers, such as IBM-compatible, Apple®, Macintosh®, Android™, or other computer platforms. The controller may also include any commercially available operating system software, such as Windows, Operating System/2®, Unix®, or Linux, or any commercially available and/or custom software such as communications software or microscope monitoring software. Furthermore, the controller may include any types of input devices such as a touchpad, keyboard, mouse, microphone, or voice recognition.

The controller software, such as a monitoring module, may be stored on a computer-readable medium such as a magnetic, optical, magneto-optic, or flash medium, floppy diskettes, CD-ROM, DVD, or other memory devices, for use on standalone systems or systems connected by a network or other communications medium, and/or may be downloaded, such as in the form of carrier waves, or packets, to systems via a network or other communications medium.

The controller may control operation of the aberration-correcting dark-field TEM column. Alternatively or in addition, the controller may receive an image from the detector of the TEM to be processed computationally. For example, the controller may process collected particle data and/or process any desired images. The controller may include an image formation unit for this purpose. The image formation unit may be disposed within or external of the aberration-correcting dark-field TEM column and communicate with the microscope column in any fashion such as directly or indirectly coupled, or communicate via a network.

Moreover, the various functions of the aberration-correcting dark-field TEM may be distributed in any manner among any quantity such as one or more of hardware and/or software modules or units, computer or processing systems or circuitry, where the computer or processing systems may be disposed locally or remotely of each other and communicate via any suitable communications medium such as LAN, WAN, Intranet, Internet, hardwire, modem connection, or wireless. The software and/or algorithms described above may be modified in any manner that accomplishes the functions described herein.

The aberration-correcting dark-field TEM may use any number of images of a sample to determine optimal beam parameter settings and/or image quality values. The images may cover any desired variation range for a particular parameter. The sample may be of any quantity, may be of any shape or size, and may include any desired features. For example, the sample may include a specific configuration for a desired application or parameter setting. The sample may be disposed at any desired location on or off the stage to acquire images. In one example, the sample is in the form of a product specimen such as a semiconductor device.

The aberration-correcting dark-field TEM may also use any number of images for the image quality comparison, where the image quality values for current and prior images may be combined in any suitable fashion, such as averaged, weighted, or summed. The user threshold may be set to any suitable values depending upon the desired image quality. The comparison of image quality values may utilize any mathematical or statistical operations to determine image quality compliance such as a comparison, statistical variance, or deviation.

The aberration-correcting dark-field TEM may analyze any suitable characteristics, such as intensity, pixel counts, or power, and utilize any differentiating characteristic between settings in any desired region. The region of separation may be of any shape or size and be located within any desired range. The aberration-correcting dark-field TEM may also utilize any suitable modeling or approximation techniques to determine best fit lines and/or curves such as linear or non-linear regression, curve fitting, least squares, or integration. The models may approximate the data within any suitable tolerances. The aberration-correcting dark-field TEM may identify any quantity of separation regions and utilize any suitable techniques to combine and/or select resulting slope values such as lowest slope, average, weighting, or sum.

The parameter determination may be triggered in any suitable fashion. For example, the machine manager may monitor the microscope to initiate the determination, the computer system or controller may periodically retrieve images based on a periodic acquisition of sample images or poll the image store to determine the presence of sample images, or manually trigger determination. The quality inspection and/or parameter determination may be initiated in response to any suitable conditions (e.g., within any desired time interval such as within any quantity of hours or minutes, subsequent any quantity of images generated by the microscope such as every Nth scan performed by the microscope, subsequent any quantity of quality inspections.

The aberration-correcting dark-field TEM technique may be performed automatically, where parameters are determined and applied to the microscope. Alternatively, any part of the technique, such as scanning of images, determination of parameters, or application of the parameters, may be performed manually. For example, the computer system may provide the optimal settings to a technician that manually applies the settings to the microscope. The microscope controller may perform any desired processing, such as monitoring and parameter adjustment or image formation and processing.

Implementation of aspects of the aberration-correcting dark-field TEM, such as the image processing or aberration correction, may be distributed among the computer system, microscope controller, or other processing device in any desired manner, where these devices may be local or remote in relation to one another. The computer system and microcontroller communicate with and/or control the microscope to perform any desired functions, such as scan the specimen and generate the images or transfer images to memory.

A computer simulation was carried out to demonstrate the efficacy of an exemplary embodiment of an aberration-correcting ADF-TEM. FIGS. 8A, 8B, and 8C illustrate the results of this simulation providing preliminary performance results of a prototype charge-on-axis corrector. FIG. 8A shows two points separated by 1 nm that are projected from image plane 431 through unipotential lens 432, which exhibits spherical aberration. Unipotential lens 432 focuses the rays emanating from the two points to a beam crossover region 436 farther down the optical path. Aberration corrector 433 contains two charge elements 434, on which a thin foil 435 is supported. The rays passing through the thin foil 435 are diverged depending on their angle, correcting the spherical aberration inherent in unipotential lens 432. FIG. 8B shows a magnification of 150 times of crossover region 436, and FIG. 8C shows a magnification of 22,500 times of the same crossover region 436, showing two distinct highly localized crossover points separated by distance d=14 nm, corresponding to a magnification factor by the corrected lens of 14 times. This simulation showed a high degree of convergence by a charge-on-axis aberration corrector inside the objective lens.

This computer simulation also shows an embodiment of a novel double-sided foil corrector that is additionally asymmetric. The double-sided corrector may allow the aberration corrector to achieve the required amount of correction with smaller potentials than may be required for a single-sided corrector. In addition, the asymmetry of the corrector may allow some—or even complete—cancellation of fifth-order aberrations by a mechanism similar to that shown in FIG. 5.

Aberration-correcting dark-field TEM enables high-throughput, atomic-resolution electron microscopy at a relatively small size. In particular, there may be a number of advantages to making the aberration-correcting dark-field TEM column small and using electrostatic components, as in one version. For example, such a column may be less expensive to construct because the components can be relatively simple. The components may include conductive electrodes that are made of platinum, or alternatively metals such as platinum-coated or gold-coated aluminum molybdenum, titanium, or stainless steel. Although platinum may be functionally advantageous, these alternative materials may make the commercial device substantially less expensive to manufacture.

Aberration-correcting dark-field TEM can provide advantages in size, speed, and sensitivity over conventional electron microscope (EM) systems. With these advantages, new products and applications can be made available to both research and commercial sectors. For example, aberration-correcting dark-field TEM can enable practical, high-throughput DNA sequencing, as described in more detail below. Moreover, very small EM structures may be provided, also as described in more detail below. In addition, the aberration correction approaches described above create a foundation for promising applications.

An example of an advantageous commercial embodiment of aberration-correcting ADF-TEM is a small, relatively inexpensive column. For example, the column of the microscope may have dimensions of from about 2.0 m×1.5 m×1.5 m to about 10 cm×5 cm×5 cm, or the volumetric equivalent thereof. In an even smaller version, the column may have dimensions of from about 75 cm×50 cm×50 cm to about 10 cm×5 cm×5 cm, or the volumetric equivalent thereof. The combination of small form-factor and low cost opens up the opportunity for entirely new, consumer-focused applications.

Beyond the cost and size advantage of this consumer-product approach to developing EM systems, there is also an advantage in the scaling of the optics. Since optical properties scale with the physical size in an optical system, the smaller the size of the aberration-correcting ADF-TEM system, the smaller the aberrations. Thus, when the aberration-correcting ADF-TEM column is reduced in size, the resolution improves by the same factor up to the diffraction limit of the electrons at the operating energy. For example, the microscope may have a spatial resolution of from about 10 nm to about 0.01 nm. A preferable version may have a spatial resolution of from about 1 nm to about 0.1 nm.

A particularly useful application of aberration-correcting dark-field TEM is to analyze a DNA sample in order to determine the sequence of its base pairs. In one version, a single strand of DNA is stretched using techniques that have been described in PCT Publication No. WO 2009/046445 dated Sep. 4, 2009, entitled "Sequencing Nucleic Acid Polymers with Electron Microscopy," and filed as International Application No. PCT/US2008/078986 on Jun. 10, 2008 (this PCT publication is hereby incorporated by reference in its entirety). A particular set of bases has been labeled with a label that contains at least one heavy scatterer, such as a single heavy atom or a cluster of atoms. Examples of such labels include osmium, triosmium, and platinum.

In a DNA sample labeled in this manner, the labels, such as single atoms or small clusters of atoms, scatter electrons strongly in an environment that otherwise includes elements that are light scatterers such as, for example, carbon, hydrogen, and oxygen, with a few other elements, such as a small amount of phosphorus, a small amount of nitrogen, and small amounts of other relatively light elements. Therefore, the background on which the heavy scattering elements are to be measured by the aberration-correcting dark-field TEM may provide a good contrast to the labels.

In this way, the combination of the dark-field mode and aberration correction enables high-contrast imaging that permits the distances between the labeled bases to be evaluated quickly. The aberration-correcting dark-field TEM provides sufficient resolution to be able to see the single atoms or clusters of atoms, given the resolution and the signal-to-noise ratio. The dark-field mode discriminates the heavier elements that scatter to higher angles from the lighter elements that scatter to lower angles.

In one version, the aberration-correcting dark-field TEM is adapted to operate in an incoherent illumination mode. In this mode, the coherence of illumination of the aberration-correcting dark-field TEM is either substantially mitigated or eliminated completely. Incoherence means that different sets of electrons impinging on the specimen are incoherent in relation to one another. In one embodiment, the dark-field TEM is implemented with a substantially incoherent electron source. For example, the electron beam source may be adapted to generate an electron beam having an energy spread of less than about 1 eV. Alternatively or in addition, the dark-field TEM may produce electron beams that are incoherent in relation to one another at different times. For example, the dark-field TEM may differently shift or scan the electron beam over time. In yet another example, the dark-field TEM spreads the energy of the electrons in the beam over different predefined ranges of energies over time.

By using incoherent illumination, more current can potentially be directed onto the specimen while simultaneously improving the contrast between single heavy atoms or clusters of atoms and a relatively light atom substrate of the specimen. Incoherent sources can often achieve higher current in exchange for coherence. The contrast improvement arises from the fact that the contrast due to the heavy atom does not depend on interference of a coherent electron wave whereas the details of speckle contrast from the specimen do. Each electron wave that contributes to the image will therefore add intensity at the heavy atom position but average out intensity in the speckle contrast. This improvement may be particularly suited for a system that needs higher data throughput and less expensive electron sources. In other words, the incoherent illumination mode may enable higher throughput, less expensive sources, and better contrast.

The incoherence provides a contrast mechanism that allows direct interpretability of the resulting images. Under incoherent illumination conditions, phase contrast is reduced whereas amplitude contrast is increased by the mechanism of superposition: the randomness of image features in phase contrast signals interferes destructively whereas the scattering from point-like objects sums incoherently. In the aggregate, the scattering information from the point-like objects is retained while the phase contrast information from the amorphous substrate is intentionally washed out.

While the incoherent dark-field TEM can be built de novo from specifically designed components, there may be practical advantages to modifying conventional EM systems to provide the advantageous characteristics of the inventive systems. For example, such modification may allow existing EM facilities to upgrade their current equipment to obtain the advantages of the incoherent dark-field TEM at an advantageous cost without requiring the construction of an entirely new EM system. The modification may include retrofit of new components and realignment or repositioning of existing components, such as of components in the upper column of the EM.

Figure 9:
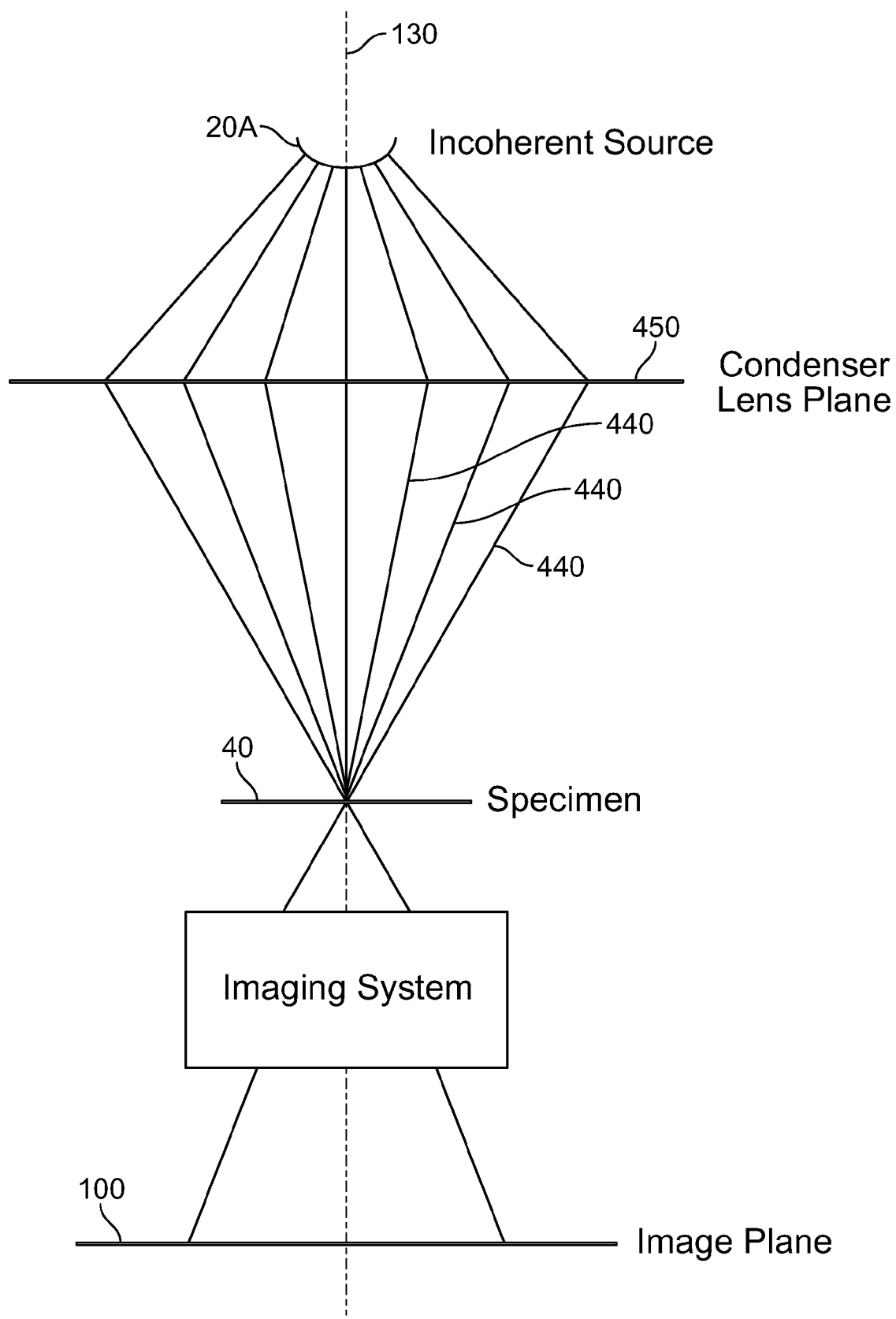
FIG. 9 is a schematic diagram of an exemplary embodiment of an implementation of an incoherent illumination mode using an incoherent electron source.

FIG. 9 illustrates an exemplary embodiment of an implementation of an incoherent illumination mode using an incoherent electron source 20A. A filled cone of many different beams 440 that are incoherent in relation to one another, referred to as incoherently related pencils of illumination, are emitted by electron source 20A. Each of incoherently related beams 440 is a constituent that is incoherent in relation to the other constituents. A summation of self-canceling phase contrast noise and self-reinforcing amplitude signal occurs simultaneously at image plane 100, so a usable image can be produced at once. Incoherent electron source 20A may be, for example, an electron source having a tungsten or lanthanum hexaboride filament. Incoherent electron source 20A may be combined with two or more condenser lenses 450, which can be excited in different configurations to allow alignment in a coherent illumination mode and then imaging operation in incoherent illumination mode.

Alternatively or in addition, the incoherent illumination mode may be implemented in the dark-field TEM without an incoherent electron source. For example, the incoherent illumination mode may be implemented by generating electron beams that are incoherent in relation to one another at different times. This may be preferable where a conventional EM system designed for coherent-mode operation is being modified into one of the incoherent-mode embodiments described herein.

During exposure of the image, either the angle, the position, or the energy of the source may be altered. These changes may be made on the time scale of the exposure. In an illustrative example, if the image is a one-second exposure, any combination of the energy, position, and angle can be oscillated, such as, for example, on the order of about 10 times the exposure time. With an incoherent illumination mode, a much higher beam current can typically be achieved on the specimen than with coherent illumination, and therefore imaging may take place much faster. More typically, the exposure time would be, rather than one second, on the order of milliseconds or microseconds. An advantage of incoherent illumination mode, particularly for the application of DNA sequencing (or any application involving identifying single heavy atoms or clusters of atoms on an otherwise low density background), may be an increase in the speed of image acquisition that goes with the increased amount of current that impinges on the specimen.

Either rocking or scanning the electron beam may work as long as the rocking or scanning is sufficiently fast. Furthermore, it may suffice to scan or rock the beam within the angular range that is collected by the aperture of the objective lens. This angular range may be considered a limiting factor since, beyond this angular range, the current impinges on the aperture and does not get detected. However, it may be desirable to scan or rock the beam slightly beyond the angular range that is collected by the aperture of the objective lens, since scattering into the aperture may nevertheless occur. Nevertheless, rocking or scanning the beam across an angular range of more than twice the acceptance angle of the objective lens may not be desirable since it would waste current.

A conventional EM system designed to operate in a coherent illumination mode may be modified into one of the embodiments described herein. This EM system may include an optimized system of condenser lenses, such as two to five condenser lenses. The electron source of the conventional EM system may be replaced with an incoherent electron source, such as one of the incoherent electron sources described herein. In addition, deflectors or other mechanisms may be added for laterally shifting or angularly wobbling the beam, and/or a mechanism may be added to vary the accelerating voltage applied to the beam. Aberration-correcting illumination systems may be available from, for example, JEOL Ltd. of Tokyo, Japan; FEI Company of Hillsboro, Oreg.; and Carl Zeiss NTS GmbH of Oberkochen, Germany (such as Zeiss's Köhler illumination system). The trajectories of the electron rays through one or more of the lenses of the illumination system may be altered.

The acceptance angles of the objective lens may be determined based on the desired resolution of the microscope. For example, if 0.1 nm resolution at 100 kilovolts is desired, one may need approximately 20 milliradians acceptance half-angle, and therefore one might preferably not go beyond 40 milliradians of illumination half-angle. With a greater angular range, current may undesirably be wasted. In one example, single-atom resolution—namely resolution at least as good as about 0.3 nanometers and in some instances at least as good as about 0.15 nanometers—may be desirable for a DNA-sequencing application. Once a suitable accelerating voltage is chosen, that resolution requirement may determine the acceptance angle of the objective lens.

A conventional EM system whose illumination trajectories have been modified to achieve relatively incoherent illumination can be further improved to take advantage of the higher current enabled by incoherent illumination by increasing the speed of the detector or stage. For example, a piezoelectric stage may be used. The piezoelectric stage may be able to move very quickly and settle very quickly and stably so that short exposures of the order of milliseconds or microseconds can be practically achieved. The piezoelectric stage may also be adapted to move the stage with very high positional precision. Furthermore, the throughput of data that emerges from the detector, which in this case may be a high-speed camera, may be quite large, such that electronics capable of dealing with this data throughput downstream of the camera may be desirable.

Some of the methods of achieving an incoherent illumination mode include taking a number of image constituents that are individually coherent and combining these image constituents incoherently. There are several different ways of generating and incoherently combining these image constituents, as described in more detail below.

FIG. 10 illustrates an exemplary embodiment of a reference version of an ADF-TEM that other exemplary embodiments described below will be compared to for the sake of illustration. Illumination 460 is provided parallel to optic axis 130 and onto specimen 40. Beams scattered from specimen 40 are collected by the objective lens in objective lens plane 470, which focuses the beams onto image plane 100. In back focal plane 480 of the objective lens, a diffraction pattern is formed that is the Fourier transform of specimen 40, representing angles of scatter from specimen 40. Three scattered beams 490 are shown demonstrating that rays scattered to the same angle by different points on specimen 40 converge to specific points in back focal plane 480 representative of their scattering angle. In projection, the three points correspond to scattering vectors g, 0 (forward-scattered), and −g. Back focal plane 480 contains annular aperture 60, which includes a beam stop 600, a central disc that leaves an opening 610 with outer diameter D for implementing the annular-dark-field mode. While the left and right scattered beams pass through annular aperture 60, the forward-scattered beam (0) is blocked by beam stop 500 in back focal plane 480. Only the rays passing through annular aperture 60 propagate to image plane 100, forming a dark-field image.

There is a relationship between the aperture diameter D and resolution. Aperture 60 selects the range of angles that are used to form the image or probe in TEM or STEM, respectively. In the case of TEM, specimen 40 is illuminated and electrons are scattered from different points on specimen 40. The electrons scattered to a particular angle from different parts of specimen 40 are brought to a common point in back focal plane 480, and then propagated further until they form an image. Aperture 60 thus selects the angles which form the image by limiting the rays passing through back focal plane 480. In the case of STEM, where a source produces a plane wave that enters the objective lens, the objective aperture placed in back focal plane 480 limits the size of illumination entering the objective lens. The rays that the objective lens focuses to a point on the specimen are thus limited in angle by the aperture.

FIG. 11 illustrates a schematic diagram of an exemplary embodiment of an implementation in which an electron beam 620 is tilted at an angle in relation to optic axis 130 of the EM column. Electron beam 620 may be scanned radially such that electron beam 620 keeps substantially the same angle in relation to optic axis 130, forming a substantially cylindrically symmetric cone of electron illumination about optic axis 130. Alternatively, the angle of tilted electron beam 620 may be flipped between two angles that are symmetric (or "minor" angles) with respect to optic axis 130, the figure showing an example of one of the two mirror angles. For example, electron beam 620 may be passed through a tilting prism that is used to alternately flip electron beam 620 between these two minor angles. Specimen 40 scatters the incident electrons, resulting in scattered beams 630, shown in the figure as two beams on the sides and the one beam in the middle. Scattered beams 630 are focused by the objective lens to the image plane. Scattered beams 630 create a diffraction pattern in back focal plane 480 and are filtered by aperture 633 with a circular disc opening 637. Image constituents from different scan positions of electron beam 620 are summed. These image constituents are incoherent in relation to one another. By illuminating specimen 40 through a cone of illumination, or alternately illuminating specimen 40 at mirror angles, and collecting these image contributions on image plane 100 over time, an incoherently-summed image can be produced. The tilt angle may be less than about 100 milliradians in relation to optic axis 130 and may exceed the aperture radius D/2.

As shown in FIG. 11, these embodiments may be implemented in dark-field mode without annular aperture 60 having central beam stop 600. As shown in the figure, aperture 633 may be adapted, and the tilt angle may be selected, to be sufficiently high, to cause the zero beam to impinge on aperture 633 and not pass through opening 637 in back focal plane 480. While the right scattered beam pass through aperture 633, the forward-scattered beam (0) and left scattered beam are blocked by aperture 633 in back focal plane 480. Only the rays passing through opening 637 propagate to image plane 100, forming a dark-field image. Alternatively, an annular aperture, such as shown in FIG. 10, may be used in place of aperture 633 with circular disc opening 637.

Figure 12:
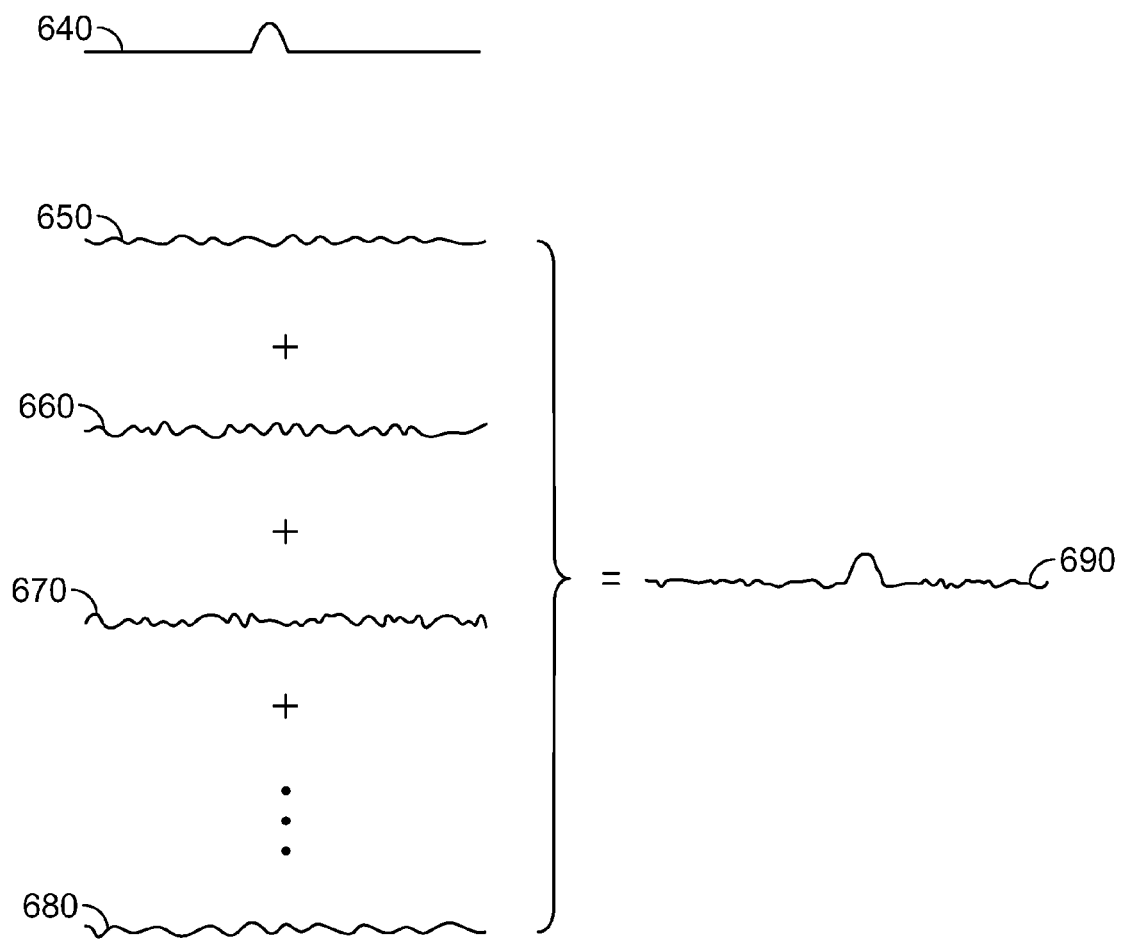
FIG. 12 is a set of plots illustrating a generalized version of the manner in which amplitude contrast is summed while phase contrast is decreased to improve the image of an object being identified in the specimen.

FIG. 12 illustrates a generalized version of the manner in which amplitude contrast is enhanced in incoherent annular-dark-field imaging while phase contrast is decreased to improve contrast of point-like objects in the specimen. This figure shows an ideal amplitude signal 640 from a specimen containing a point-like object on an amorphous background. For the sake of illustration, different incoherently related image constituents, labeled as 650, 660, 670, 680, etc., that are created from the object are shown as vertically arranged. For each of these image constituents, the horizontal axis represents position and the vertical axis represents signal amplitude. Each of the image constituents contains an amplitude contrast component and also a phase contrast component. The latter component dominates in TEM images, as can be seen in image constituents 650, 660, 670, 680, etc. The methods described herein extract amplitude signal 640 from the phase contrast noise.

For example, a number of image constituents 650, 660, 670, 680, etc., are taken either in sequence or simultaneously in a particular imaging mode. In each of image constituents 650, 660, 670, 680, etc., the amplitude signal is small in comparison to the speckle noise from the phase contrast. However, the speckle noise varies substantially between different image constituents 650, 660, 670, 680, etc. Meanwhile, hidden within this noise is a weak yet consistent amplitude signal 640 between different constituents 650, 660, 670, 680, etc. Thus, when image constituents 650, 660, 670, 680, etc., are superimposed, the phase contrast noise tends to cancel while amplitude signal 640 reinforces, forming an increasingly discernible signal 690 as more incoherently-related constituent images are included.

Figure 13:
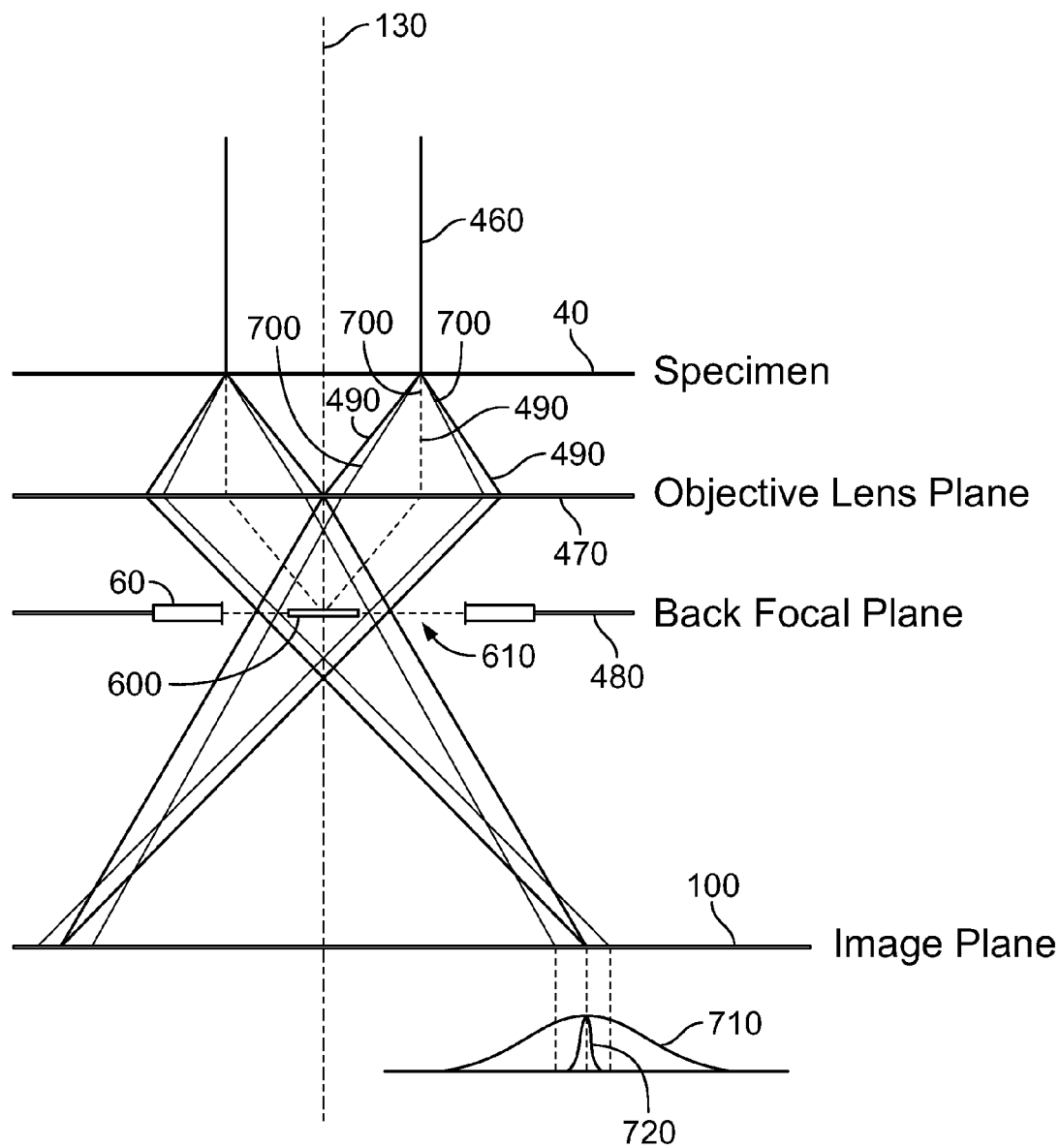

FIG. 13 illustrates an example of yet another embodiment of the implementation of incoherent superposition. In this figure, different energies are used such that the scattering angles change slightly. Since the objective lens focuses higher energy electrons less strongly than lower energy electrons, the scattering angles from the specimen vary accordingly, as indicated in the figure by scattered beams 490 and 700, representing, respectively, lower and higher energy beams. In this figure, in contrast to FIG. 10, part of the beam that would have been imaged as a point in image plane 100 is now imaged onto a diffuse region 710 and another part of beam 460 that would have been imaged onto a point is now imaged onto a narrower diffuse region 720. While regions 710 and 720 represent diffuse images of the same point of specimen 40, their centers are still approximately in the same location when projected onto image plane 100. A point-like amplitude object, when imaged in this way, will consistently be imaged to the same point. Simultaneously, speckle contrast from the background will be averaged out.

Adjustment of electron energy can be achieved by various alternative methods including, for example, choosing a source with a large energy spread in the electron source, increasing the chromatic aberration in the illumination system, and modulating the voltage applied to the electron source with time at a frequency greater than the exposure frequency.

FIG. 14 illustrates an example of yet another embodiment of the implementation of incoherent superposition. In this embodiment, images exposed at different times are summed. Again, through the summation, more amplitude contrast is generated while the phase contrast is decreased.

Figure 15:
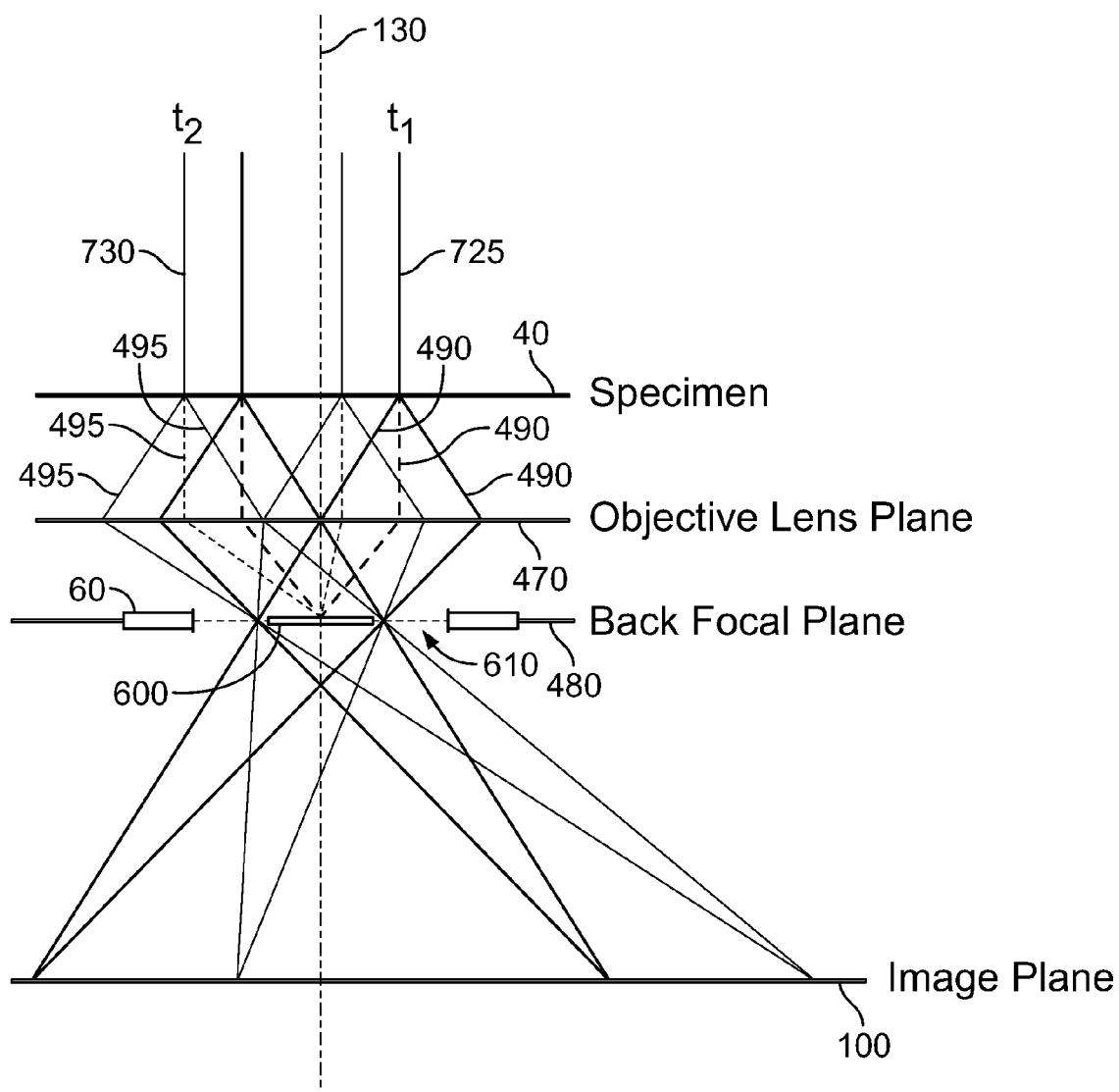

FIG. 15 illustrates still another exemplary embodiment of the implementation of incoherent superposition. In FIG. 15, the electron beam is shifted laterally to different lateral positions, such as position 725 and position 730, at different times to obtain different sets of scattered beams 490 and 495 and the resulting different relatively incoherent constituents. This shift can be achieved in one example by using dipole deflectors to shift the beam before it reaches the sample.

Figure 16:
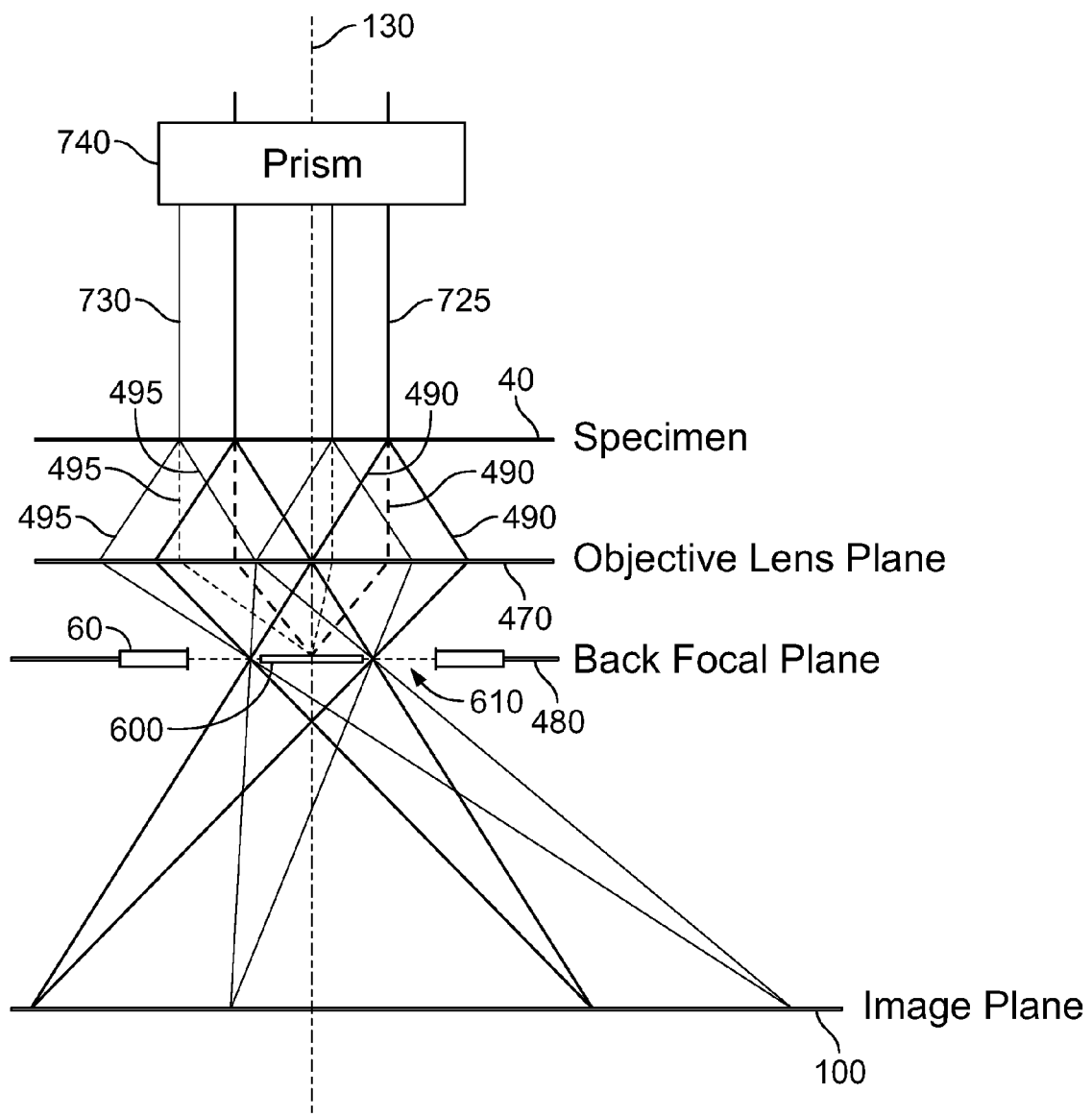

FIG. 16 illustrates yet another embodiment in which a prism 740 is used in the beam path to shift all or a portion of the beam, such as from position 725 to position 730.

The examples shown in FIGS. 11, 13, 14, 15, and 16 illustrate various embodiments in which constituent images are exposed serially or in parallel to improve amplitude contrast relative to phase contrast, thereby improving interpretability of the image.

The electron energy used in the dark-field TEM may be determined at least in part based on the transmission properties of the specimen. The specimen may have a thickness on the order of 2 nanometers, such as for example a thickness of about 1 nanometer. In one example, the specimen is made of carbon, although single-atom-thick graphene may also be used. As a result, 1 keV electrons are likely to be the lowest energy appropriate when considering voltage alone.

Unfortunately, since electron wavelength varies inversely with energy, the diffraction limit may require the angles to be corrected to be large. Such an aberration-correcting dark-field TEM may become challenging to manufacture. It may be desirable for the dark-field TEM to be operated at a much higher voltage, such as from about 1 kV to about 300 kV. For example, the dark-field TEM may be operated at about 30 kV. This voltage range is in the realm of conventional microscopy, and the implementation of electrostatic correction elements may be unfeasible in this range due to the risk of damage from high local fields, high voltage discharge, and transmission of high-energy electrons.

For miniaturized embodiments of the aberration-correcting dark-field TEM column, the voltage may be based in part on the dimensions of the miniaturized embodiments. The miniaturization of the column could go even further than described above. Such a miniaturized aberration-correcting dark-field TEM column remains a column with aberration correction by charge-on-axis elements with substantially the same features described herein. A specialized detector may also be useful so that operation of the instrument is in STEM mode or SEM mode, rather than in TEM mode. In that case, a fabricated solid-state backscatter detector may be provided.

The dark-field TEM may preferably use a beam current of from about 10 picoamps to about 1 milliamp. At beam currents above around 100 microamps, coherence decreases. When an incoherent illumination mode is intended, the high spatial charge density may desirably increase the incoherence. Thus, for an incoherent illumination mode, a beam current above 100 microamps may be used advantageously.

Furthermore, it may be desirable for the beam to be sufficiently monochromatic, in other words to have a sufficiently narrow range of energies, to avoid focus problems. A spread in energies of the electrons in the beam typically causes a corresponding change of focus of the image. Thus, the image may be thought of as a sum of many images that have changing foci. If that range is too large, then the intensity of a single atom in the image may get blurred out over a large region and thereby become indistinguishable from the background. Thus, it may be preferable to have an energy spread of less than about 10 eV to avoid such blurring. Where a tighter focus is desired, however, it may be preferable to have an energy spread of less than about 1 eV. For example, the electron beam may even have an energy spread of less than about 200 meV. This may be desirable where there is no chromatic aberration correction in the optical system. In other circumstances, however, such as if chromatic-aberration correction is implemented in the optical system, much larger energy spreads may be used. For example, the chromatic-aberration correctors described herein may be able to handle hundreds of electron volts of energy spread.

Although the foregoing embodiments have been described in detail by way of illustration and example for purposes of clarity of understanding, it will be readily apparent to those of ordinary skill in the art in light of the description herein that certain changes and modifications may be made thereto without departing from the spirit or scope of the appended claims. It is also to be understood that the terminology used herein is for the purpose of describing particular aspects only, and is not intended to be limiting, since the scope of the present invention will be limited only by the appended claims.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only," and the like in connection with the recitation of claim elements, or use of a "negative" limitation. As will be apparent to those of ordinary skill in the art upon reading this disclosure, each of the individual aspects described and illustrated herein has discrete components and features which may be readily separated from or combined with the features of any of the other several aspects without departing from the scope or spirit of the disclosure. Any recited method can be carried out in the order of events recited or in any other order which is logically possible. Accordingly, the preceding merely provides illustrative examples. It will be appreciated that those of ordinary skill in the art will be able to devise various arrangements which, although not explicitly described or shown herein, embody the principles of the disclosure and are included within its spirit and scope.

Furthermore, all examples and conditional language recited herein are principally intended to aid the reader in understanding the principles of the invention and the concepts contributed by the inventors to furthering the art, and are to be construed without limitation to such specifically recited examples and conditions. Moreover, all statements herein reciting principles and aspects of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary configurations shown and described herein. Rather, the scope and spirit of present invention is embodied by the claims.

In this specification, various preferred embodiments have been described with reference to the accompanying drawings. It will be evident, however, that various other modifications and changes may be made thereto and additional embodiments may be implemented, without departing from the broader scope of the claims that follow. The specification and drawings are accordingly to be regarded in an illustrative rather than restrictive sense.

We claim:

1. A transmission electron microscope comprising:
an electron beam source to generate an electron beam;
beam optics to converge the electron beam;
an aberration corrector to correct the electron beam for at least a spherical aberration;
a specimen holder to hold a specimen in the path of the electron beam; and
a detector to detect the electron beam transmitted through the specimen,
wherein the transmission electron microscope is adapted to operate in a dark-field mode in which a zero beam of the electron beam is not detected.

2. The transmission electron microscope of claim 1, wherein the electron beam source is adapted to generate a substantially coherent electron beam.

3. The transmission electron microscope of claim 2, wherein the beam optics define an optic axis of the microscope along which there is substantial cylindrical symmetry of the beam optics, and wherein the aberration corrector comprises an element located approximately at the optic axis.

4. The transmission electron microscope of claim 3, wherein the element is an electrostatic charge element.

5. The transmission electron microscope of claim 1, wherein the electron beam source is adapted to generate a substantially incoherent electron beam with energy spread of less than about 1 eV.

6. The transmission electron microscope of claim 5, wherein the electron beam source comprises a tungsten or lanthanum hexaboride filament.

7. The transmission electron microscope of claim 5, wherein the electron beam source is adapted to generate an electron beam with a current of at least about 100 nA.

8. The transmission electron microscope of claim 5, wherein the transmission electron microscope is adapted to laterally shift the electron beam during detection.

9. The transmission electron microscope of claim 1, further comprising a beam deflector to angularly scan the electron beam in a conical illumination pattern about an optic axis of the microscope.

10. The transmission electron microscope of claim 1, wherein the aberration corrector comprises a set of electrostatic or magnetic elements that break cylindrical symmetry.

11. The transmission electron microscope of claim 1, comprising an annular aperture to produce the dark-field mode, the annular aperture comprising (i) a circular-disc stop with a substantially circular cross-section approximately at the radial center of the electron beam to block a central portion of the electron beam; and (ii) an outer stop concentric with, and spaced from, the circular-disc stop, such that there is an annular gap between the circular-disc stop and the outer stop through which a portion of the electron beam can pass.

12. The transmission electron microscope of claim 11, wherein the beam optics comprise an objective lens, and wherein the annular gap has an opening of from about 15 mrad to about 50 mrad in relation to the objective lens.

13. The transmission electron microscope of claim 1, wherein the aberration corrector comprises a charge-on-axis corrector comprising at least one electrostatic charge element located approximately at an optic axis of the microscope, and comprising an annular aperture to produce the dark-field mode, the annular aperture comprising an outer stop concentric with, and spaced from, the charge element, such that there is an annular gap between the charge element and the outer stop.

14. A transmission electron microscope comprising:
an electron beam source to generate an electron beam;
beam optics to converge the electron beam, the beam optics defining an optic axis of the microscope along which there is substantial cylindrical symmetry of the beam optics;
an aberration corrector comprising an element located approximately at the optic axis, the aberration corrector being adapted to correct the electron beam for at least a spherical aberration;
a specimen holder to hold a specimen in the path of the electron beam; and
a detector to detect the electron beam transmitted through the specimen,
wherein the transmission electron microscope is adapted to operate in a dark-field mode in which a zero beam of the electron beam is not detected.

15. The transmission electron microscope of claim 14, wherein the electron beam source is adapted to generate a substantially coherent electron beam.

16. The transmission electron microscope of claim 14, wherein the electron beam source is adapted to generate a substantially incoherent electron beam with energy spread of less than about 1 eV.

17. A transmission electron microscope comprising:
an incoherent electron beam source to generate an incoherent electron beam;
beam optics to converge the electron beam;
an aberration corrector to correct the electron beam for at least a spherical aberration;
a specimen holder to hold a specimen in the path of the electron beam;
a detector to detect the electron beam transmitted through the specimen,
wherein the transmission electron microscope is adapted to operate in a dark-field mode in which a zero beam of the electron beam is not detected.

18. An electron beam component assembly for a transmission electron microscope, the electron beam component assembly comprising:
an electron beam source to generate an electron beam;
an aberration corrector to correct the electron beam for at least a spherical aberration; and
a detector to detect the electron beam after the electron beam has been transmitted through a specimen,
wherein the electron beam component assembly is adapted to operate in a dark-field mode in which a zero beam of the electron beam is not detected.

19. The electron beam assembly of claim 18, comprising an annular aperture to produce the dark-field mode, the dark-field stop comprising (i) a circular-disc stop with a substantially circular cross-section approximately at the radial center of the electron beam to stop a central portion of the electron beam; and (ii) an outer stop concentric with, and spaced from, the circular-disc stop, such that there is an annular gap between the circular-disc stop and the outer stop.

20. A dark-field aberration corrector for a transmission electron microscope, the dark-field aberration corrector comprising:
an aberration corrector to correct an electron beam for at least a spherical aberration; and
a dark-field aperture comprising a dark-field stop comprising (i) a circular-disc stop with a substantially circular cross-section approximately at a radial center of the electron beam to stop a central portion of the electron beam; and (ii) an outer stop concentric with, and spaced from, the circular-disc stop, such that there is an annular gap between the circular-disc stop and the outer stop.

* * * * *

UNITED STATES PATENT AND TRADEMARK OFFICE
CERTIFICATE OF CORRECTION

PATENT NO. : 8,324,574 B2  
APPLICATION NO. : 13/024961  
DATED : December 4, 2012  
INVENTOR(S) : Own et al.

Page 1 of 1

It is certified that error appears in the above-identified patent and that said Letters Patent is hereby corrected as shown below:

In the Specifications:

Column 4, line 66 – "$N=N_0 A$" should read -- $N=N_0/A$ --.

In the Claims:

Column 26, in claim 17, line 15 – After "electron beam;" insert -- and --.

Signed and Sealed this  
Fifteenth Day of January, 2013

David J. Kappos  
*Director of the United States Patent and Trademark Office*

UNITED STATES PATENT AND TRADEMARK OFFICE
CERTIFICATE OF CORRECTION

PATENT NO. : 8,324,574 B2
APPLICATION NO. : 13/024961
DATED : December 4, 2012
INVENTOR(S) : Own et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 17 days.

Signed and Sealed this
Seventh Day of May, 2013

Teresa Stanek Rea
*Acting Director of the United States Patent and Trademark Office*